(12) United States Patent
Ishida et al.

(10) Patent No.: US 6,329,065 B1
(45) Date of Patent: Dec. 11, 2001

(54) WIRE BOARD AND METHOD OF PRODUCING THE SAME

(75) Inventors: Masanobu Ishida; Shigeki Yamada; Yasuhiko Yoshihara; Masamitsu Onitani, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/378,849

(22) Filed: Aug. 23, 1999

(30) Foreign Application Priority Data

| Aug. 31, 1998 | (JP) | ................................................ | 10-244237 |
| Aug. 31, 1998 | (JP) | ................................................ | 10-245360 |
| Sep. 29, 1998 | (JP) | ................................................ | 10-276187 |
| Nov. 26, 1998 | (JP) | ................................................ | 10-336363 |
| Dec. 21, 1998 | (JP) | ................................................ | 10-363432 |
| Mar. 25, 1999 | (JP) | ................................................ | 11-080699 |

(51) Int. Cl.⁷ .............................. H05K 1/03; H05K 1/05; B32B 15/04
(52) U.S. Cl. .................... 428/472; 428/209; 428/210; 428/204; 428/432; 428/433; 428/699; 428/144; 428/901; 338/308; 338/310; 338/311; 338/314; 252/515; 252/520.5; 252/521.2; 501/127; 501/153; 174/256; 174/257; 174/258; 174/261
(58) Field of Search .................... 428/472, 210, 428/209, 212, 204, 432, 433, 428, 901, 618, 665, 687, 652, 653, 699; 338/308, 309, 310, 311, 312, 314, 323, 324; 252/515, 520.5

(56) References Cited

U.S. PATENT DOCUMENTS

| 5,170,930 | * | 12/1992 | Dolbear et al. . |
| 5,562,973 | * | 10/1996 | Nagasaka et al. . |
| 5,675,474 | * | 10/1997 | Nagase et al. . |
| 5,917,157 | * | 6/1999 | Remsburg . |
| 6,027,791 | * | 2/2000 | Higashi et al. . |
| 6,103,392 | * | 8/2000 | Dorfman et al. . |
| 6,120,906 | * | 9/2000 | Terashi . |
| 6,143,116 | * | 11/2000 | Hayashi et al. . |
| 6,166,620 | * | 12/2000 | Inuzuka et al. . |

FOREIGN PATENT DOCUMENTS

| 08008503A | * | 1/1996 | (JP) . |
| 08186346A | * | 7/1996 | (JP) . |
| 10095686A | * | 4/1998 | (JP) . |

\* cited by examiner

*Primary Examiner*—Blaine Copenheaver
*Assistant Examiner*—Jennifer McNeil
(74) *Attorney, Agent, or Firm*—Hogan & Hartson, L.L.P.

(57) ABSTRACT

A wiring board having an insulating substrate of aluminum oxide ceramics and a surface wiring layer formed on the surface of said insulating substrate, wherein the aluminum oxide ceramics constituting said insulating substrate contains a manganese compound in an amount of from 2.0 to 10.0% by weight in terms of $MnO_2$, and has a relative density of not smaller than 95%, and said surface wiring layer contains copper in an amount of from 10 to 70% by volume and at least one high-melting metal selected from the group consisting of tungsten and molybdenum in an amount of from 30 to 90% by volume, and further contains copper as a matrix, said copper matrix having a diffusion structure in which are diffused the particles of said high-melting metal having an average particle diameter of from 1 to 10 μm. The wiring board is prepared by co-firing the conducting paste for forming the surface wiring layer and the green sheet for forming the insulating substrate, and exhibits excellent heat conductivity and electric properties, and is particularly effectively used for the semiconductor devices that execute arithmetic operations at high speeds.

11 Claims, 3 Drawing Sheets

WIRE BOARD AND METHOD OF PRODUCING THE SAME

BACKGROUND OF THE INVENTION

1. Field of the Invention

The present invention relates to a wiring board equipped with an insulating substrate of aluminum oxide ceramics. More specifically, the invention relates a wiring board in which the surface wiring layer formed on the surface of the insulating substrate is formed of a low-resistance conductor, and the surface wiring layer and the insulating substrate are formed through co-firing.

2. Description of the Prior Art

As the semiconductor elements are integrated ever highly densely in recent years, the semiconductor device equipped with semiconductor elements is generating heat in ever increased amounts. In order to prevent malfunctioning of the semiconductor devices, therefore, it has been urged to provide a wiring board capable of emitting heat out of the device (thermal request).

Operation speed required for the semiconductor devices is also very increasing. To cope with an increase in the operation speed, therefore, it is essential to transmit signals without delay. For this purpose, it has been urged to decrease the conduction loss in the wiring layer of the wiring board, i.e., to form the wiring layer using a low-resistance conductor (electrical request).

As the wiring board mounting a semiconductor element, there has been widely used the one equipped with an insulating substrate of alumina ceramics and having a wiring layer of a high-melting metal such as tungsten or molybdenum formed on the surface of, or inside of, the insulating substrate, from the standpoint of maintaining high reliability in the circuit (wiring layer). In the wiring layer formed of a high-melting metal used for the above-mentioned wiring board, however, it is not possible to decrease the resistance to be smaller than 8 milliohms/□, and the above-mentioned electrical request is not satisfied.

Recently, furthermore, there has been proposed a wiring board equipped with an insulating substrate formed of glass ceramics that can be co-fired with a low-resistance conductor such as copper or silver. This wiring board is capable of satisfying the above-mentioned electrical requirement. However, the glass ceramics has a thermal conductivity which is as small as several watts/m·K at the greatest, and makes it very difficult to satisfy the above-mentioned thermal request.

In order to simultaneously satisfy the thermal request and the electrical request, therefore, Japanese Unexamined Patent Publication (Kokai) No. 8503/1996 and 15101/1995 teach the methods of forming a wiring layer comprising copper and tungsten or molybdenum on an insulating substrate of aluminum oxide ceramics having a high thermal conductivity by the co-firing.

According to the technology disclosed in Japanese Unexamined Patent Publication (Kokai) No. 8503/1996, however, the firing is effected at a high temperature which is not lower than 1600° C. in order to increase the density of aluminum oxide. Therefore, tungsten and molybdenum are quickly sintered to form coarsely coagulated particles, whereby the molten copper is separated on the surface of the wiring layer, the surface of the obtained wiring layer is oozed, the wiring layer loses stability in the shape, and the texture in the wiring layer becomes nonuniform causing the wiring layer to exhibit an increased resistance. During the step of firing, furthermore, copper in the wiring layer is diffused in the surrounding ceramics. That is, the diffusion of copper results in a drop in the insulation among the wiring layers, making it difficult to highly densely form the wiring layers having fine patterns on the insulating substrate.

According to the technology disclosed in Japanese Unexamined Patent Publication (Kokai) No. 15101/1995, a conductor layer corresponding to a wiring layer is arranged in the inside of an unfired insulating sheet that will become an insulating substrate, and is co-fired to prepare the insulating substrate. The surface of the insulating substrate is polished so that the wiring layer in the surface of the insulating substrate is exposed. Or, a thin film is formed on the surface of the insulating substrate by deposition or sputtering. Or, a thick film is formed by applying a conducting paste or by firing. Thus, the wiring layer is formed on the surface of the insulating substrate through such steps as a step of polishing, a step of forming a thick film or a step of forming a thin film. An increase in the number of the steps decreases the yield and increases the cost.

Japanese Patent No. 2666744 proposes a wiring board having an insulating substrate of aluminum oxide ceramics, and a wiring layer of copper formed on the insulating substrate by the co-firing. In this wiring board, however, the wiring layer of copper is formed by co-firing requiring the use of a very fine alumina powder having an average particle diameter of from 5 to 50 nm for forming the insulating substrate. Such a fine aluminum powder, however, is very cumbersome to handle and is expensive. Therefore, the wiring board disclosed in the above patent cannot be mass-produced and is not advantageous from the viewpoint of cost, either.

SUMMARY OF THE INVENTION

The object of the present invention, therefore, is to provide a wiring board having an insulating substrate of an aluminum oxide exhibiting a high thermal conductivity, and a surface wiring layer of a low-resistance conductor formed on the surface of the insulating substrate by co-firing, the wiring board exhibiting characteristics satisfying both the above-mentioned thermal request and electrical request, as well as to provide a method of producing the same.

Another object of the present invention is to provide a wiring board which includes at least copper as a low-resistance conductor for forming the surface wiring layer, effectively prevents a drop in the shape retentivity caused by the oozing of the surface wiring layer at the time of the co-firing and effectively prevents a drop in the insulating property among the wiring layers caused by the diffusion of copper into the surrounding ceramics, and a method of producing the same.

A further object of the present invention is to provide a wiring board in which the insulating substrate has a smooth fired surface, and which requires no after-treatment such as polishing after the firing, and a method of producing the same.

According to the present invention, there is provided a wiring board having an insulating substrate of aluminum oxide ceramics and a surface wiring layer formed on the surface of said insulating substrate;

wherein the aluminum oxide ceramics constituting said insulating substrate contains a manganese compound in an amount of from 2.0 to 10.0% by weight in terms of $MnO_2$, and has a relative density of not smaller than 95%; and said surface wiring layer contains copper in an amount of from 10 to 70% by volume and at least one high-melting metal selected from the group consisting of tungsten and molybdenum in an amount of from 30 to 90% by volume, and further contains copper as a matrix, said copper matrix having a diffusion structure in which are diffused the particles of said high-melting metal having an average particle diameter of from 1 to 10 μm.

According to the present invention, there is further provided a method of producing a wiring board comprising:

molding a starting powder for forming aluminum oxide ceramics containing manganese oxide in an amount of from 2.0 to 10.0% by weight into a predetermined shape to form a green sheet;

preparing a conducting paste for forming a surface wiring layer by using a metal powder that contains copper in an amount of from 10 to 70% by volume and particles of a high-melting metal comprising at least one selected from the group consisting of tungsten and molybdenum and having an average particle diameter of from 1 to 10 μm in an amount of from 30 to 90% by volume;

applying said conducting paste onto the surface of said green sheet in the form of a surface circuit pattern; and co-firing said conducting paste and said green sheet in a nonoxidizing atmosphere at a temperature of from 1200 to 150° C.

If roughly described, the present invention has succeeded in satisfying both the above-mentioned thermal request and the electrical request by setting the compositions of the insulating substrate and the surface wiring layer as described above, and by forming them by the co-firing at low temperatures of from 1200 to 1500° C.

DETAILED DESCRIPTION OF THE INVENTION (Wiring Board)

Figure 1:
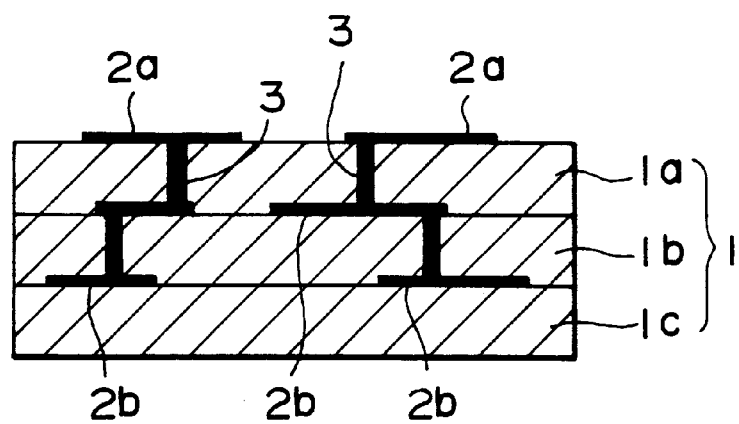
FIG. 1 is a diagram schematically illustrating a sectional structure of a wiring board according to the present invention.

Referring to FIG. 1 illustrating a sectional structure of a wiring board of the present invention, the wiring board has an insulating substrate 1 obtained by laminating three insulating layers 1a, 1b and 1c, and a surface wiring layer 2a is formed on the surface of the insulating substrate 1 (on the surface of the insulating layer 1a). Further, an internal wiring layer 2b is formed inside the insulating substrate 1, i.e., among the insulating layers 1a, 1b and 1c, the surface wiring layer 2a and the internal wiring layer 2b being electrically connected together through the via-hole conductors 3 extending through the insulating layers.

[Insulating Substrate 1]

In this wiring board, the insulating substrate 1 (insulating layers 1a, 1b, 1c) comprises aluminum oxide ceramics, and must have a relative density of not smaller than 95%, preferably, not smaller than 97% and, more preferably, not smaller than 98% from the standpoint of improving the heat conducting property and strength, and must further have a thermal conductivity of not smaller than 10 W/M·K, preferably, not smaller than 15 W/M·K and, most preferably, not smaller than 17 W/M·K.

In this embodiment, the insulating substrate 1 is formed by the co-firing with a copper-containing conductor that constitutes the surface wiring layer 2a and the internal wiring layer 2b at a low temperature of from 1200 to 1500° C. as will be described later. The insulating substrate 1 must have a high thermal conductivity, and must become so dense that its relative density lies within the above-mentioned range through the firing at such a low temperature. It is therefore, desired that the insulating substrate 1 contains aluminum oxide in an amount of not smaller than 84% by weight and further contains Mn compound in an amount of from 2.0 to 10.0% by weight and, particularly, from 3 to 7% by weight in terms of $MnO_2$. When the content of aluminum oxide is smaller than 84% by weight, the thermal conductivity tends to decrease. When the content of the Mn compound is smaller than the above-mentioned range, the insulating substrate 1 does not become dense enough through the firing at a temperature of from 1200 to 1500° C. When the content of the Mn compound is larger than the above-mentioned range, on the other hand, the insulating substrate 1 loses the insulating property.

It is desired that the insulating substrate 1 contains sintering assistants such as alkaline earth element compounds, e.g., MgO, CaO or SrO, or $SiO_2$ in an amount of from 0.4 to 8% by weight in addition to aluminum oxide and Mn compound, so that the insulating board 1 can be co-fired with the copper-containing conductor. The insulating substrate 1 may further contain a metal such as W, Mo or Cr as a coloring component in an amount of not larger than 2% by weight in terms of a metal.

In the present invention, the aluminum oxide which is the chief component of ceramics constituting the insulating substrate 1 exists in the form of a particulate or columnar crystal phase. It is desired that the crystal phase of aluminum oxide has an average particle diameter of from 1.5 to 5.0 μm. When the average crystalline particle diameter is smaller than 1.5 μm, it becomes difficult to increase the heat conducting property of the insulating substrate 1. When the average crystalline particle diameter becomes greater than 5.0 μm, on the other hand, the strength of the insulating substrate 1 tends to decrease. In particular, the average particle diameter of the aluminum oxide crystal phase is related to the diffusion distance of copper into the ceramics around the surface wiring layer 2a and the internal wiring layer 2b that will be described later. It is desired that the average particle diameter of the aluminum oxide crystal phase is not larger than 5.0 μm even from the standpoint of setting the diffusion distance to lie within a predetermined range. When the aluminum oxide crystal phase is of a columnar form, the average crystalline particle diameter is that of a short-axis diameter of the columnar crystals.

Components other than the aluminum oxide may exist as an amorphous phase or a crystal phase on the grain boundaries of the aluminum oxide crystal phase. In order to enhance the heat conducting property, it is desired that the crystal phase containing these other components are formed on the grain boundaries of the aluminum oxide crystal phase.

In the present invention, it is desired that the fired surface of the above-mentioned insulating substrate 1 has surface coarseness Ra (JIS B-0601) of not larger than 1 gm and, particularly, not larger than 0.7 μm. By using the insulating substrate 1 having a smooth fired surface, it is allowed to obtain a desired wiring board without effecting the after-treatment such as polishing after the firing.

[Surface Wiring Layer 2a, Internal Wiring Layer 2b]

In the present invention, it is very important that the surface wiring layer 2a contains copper in an amount of from 10 to 70% by volume and, particularly, from 40 to 60% by volume, and particles of at least one high-melting metal selected from the group consisting of W and Mo in an amount of from 30 to 90% by volume and, particularly, from 40 to 60% by volume. That is, by setting the composition of the surface wiring layer 2a as described above, it is allowed to decrease the resistance (sheet resistance) of the wiring layer to be smaller than 8 milliohms/□, to assure co-firing with the insulating substrate 1 and to maintain the shape retentivity of the surface wiring layer 2a after the firing. For example, when the copper content is smaller than the above-mentioned range or when the content of the high-melting metal is larger than the above-mentioned range, it becomes difficult to decrease the resistance (sheet resistance) of the surface wiring layer 2a to be not larger than 8 milliohms/□. When the copper content is larger than the above-mentioned range or when the content of the high-melting metal is smaller than the above-mentioned range, furthermore, there takes places oozing after the co-firing, and the shape retentivity of the surface wiring layer 2a decreases. Due to the molten copper at the time of firing, furthermore, the surface wiring layer 2a is coagulated and tends to become easily broken. Besides, a large difference in the coefficient of thermal expansion between the insulating substrate 1 and the surface wiring layer 2a causes the surface wiring layer 2a to be easily peeled off.

In the present invention, furthermore, it is important that the surface wiring layer 2a contains copper as a matrix, i.e., as a continuous phase, and has a diffusion structure in which the particles of the high-melting metal having an average particle diameter of from 1 to 10 μm and, particularly, from 1.3 to 5 μm are diffused in the matrix. When the particles of the high-melting metal (W, Mo) have an average particle diameter of smaller than 1 μm, the surface wiring layer 2a loses the shape retentivity and, besides, the texture of the surface wiring layer 2a becomes porous to exhibit an increased electric resistance. When the particles have an average diameter of larger than 10 μm, on the other hand, the copper matrix is cut into pieces by the high-melting metal particles, causing the surface wiring layer 2a to exhibit an increased resistance. Besides, copper is isolated and oozes out.

As required, the surface of the surface wiring layer 2a may be provided with a plated layer (not shown) based on nonelectrolytic plating, electrolytic plating or the like method in order to prevent corrosion caused by oxidation, to improve wire-bonding property, to improve wettability to the solder and to decrease the electric resistance. Examples of the metal for forming such a plated layer include Au, Cu, Ti, Ni and Pd. In particular, it is desired that the most front surface of the plated layer is formed of Au.

The surface wiring layer 2a may further contain transition metals other than W and Mo, in an amount of from 0.01 to 5 parts by volume and, particularly, from 0.1 to 3 parts by volume per 100 parts by volume of the total amount thereof with copper and high-melting metal in terms of metals. That is, the surface wiring layer 2a has a large difference in the coefficient of thermal expansion from the insulating substrate 1. When various electronic parts are mounted on the surface wiring layer 2a, therefore, the surface wiring layer 2a may often be peeled off the insulating substrate 1 due to heat given at the time of mounting. It is therefore desired to braze metal fittings such as connection terminals to the surface wiring layer 2a and mount various electronic parts on the metal fittings. Still, however, the metal fittings may often be removed due to the difference in the thermal expansion. Upon having contained the transition metals other than W and Mo in the surface wiring layer 2a, however, the adhesion can be greatly improved between the surface wiring layer 2a and the insulating substrate 1, making it possible to effectively prevent the metal fittings from being removed and to greatly improve reliability of the mounting. When the content of the transition metals is smaller than the above-mentioned range, the adhesion is not enhanced to a sufficient degree between the surface wiring layer 2a and the insulating substrate 1. When the content of transition metals is larger than the above-mentioned range, on the other hand, the surface wiring layer 2a exhibits increased electric resistance, making it difficult to decrease the sheet resistance thereof to be smaller than 8 milliohms/□.

As the above-mentioned transition metals, there can be exemplified Ti, Nb, Cr, Mn, Fe, Co and Ni, which may be used in a single kind or in a combination of two or more kinds. In the present invention, particularly preferred transition metals are Ti, Cr, Co and Ni. These transition metals exist in the copper matrix together with W and Mo in the form of diffused particles of a simple metal or a metal compound such as oxide or nitride. It is desired that the diffused particles of the transition metal has an average particle diameter of not larger than 10 μm and, particularly, not larger than 3 μm. When the average particle diameter exceeds 10 μm, the copper matrix is cut into pieces, whereby the surface wiring layer 2a exhibits an increased resistance and copper is isolated and oozes out.

The surface wiring layer 2a may further contain aluminum oxide together with the above-mentioned transition metals or in place of the transition metals, in an amount of from 0.05 to 2 parts by volume and, particularly, from 0.1 to 1 part by volume per 100 parts by volume of the total amount with copper and high-melting metal. Upon containing the aluminum oxide, it is allowed to enhance the adhesion between the surface wiring layer 2a and the insulating substrate 1. When the content of aluminum oxide is smaller than the above-mentioned range, improvement in the adhesion owing to the aluminum oxide cannot be expected. When the content of aluminum oxide is larger than the above-mentioned range, on the other hand, the surface wiring layer 2a exhibits an extremely increased resistance. It is desired that the aluminum oxide, too, has an average particle diameter similar to that of the high-melting metal particles.

In the present invention, the internal wiring layer 2b may basically have quite the same composition and the same diffusion structure as the surface wiring layer 2a. For example, in order to improve adhesiveness to the insulating substrate 1, the internal wiring layer 2b may contain predetermined amounts of transition metals and aluminum oxide other than W and Mo like the surface wiring layer 2a.

Generally, however, it is desired that the internal wiring layer 2b contains copper in an amount of from 20 to 80% by volume and, particularly, from 50 to 80% by volume, contains the high-melting metal in an amount of from 20 to 80% by volume and, particularly, from 50 to 20% by volume, and contains copper in an amount larger than that in the surface wiring layer 2a. That is, as required, the surface wiring layer 2a is provided with a metal layer such as plated layer on the surface thereof to lower the resistance. However, the internal wiring layer 2b is not allowed to be provided with a metal layer such as plated layer. When the internal wiring layer 2b has the composition quite the same as that of the surface wiring layer 2a, its resistance becomes substantially larger than that of the surface wiring layer 2a. Accordingly, the content of copper is increased in the internal wiring layer 2b to maintain the sheet resistance to be not larger than 6 milliohms, which is smaller than that of the surface wiring layer 2a. Thus, the internal wiring layer 2b is allowed to possess the resistance substantially the same as that of the surface wiring layer 2a on which the plated layer or the like layer is formed.

Figure 2:
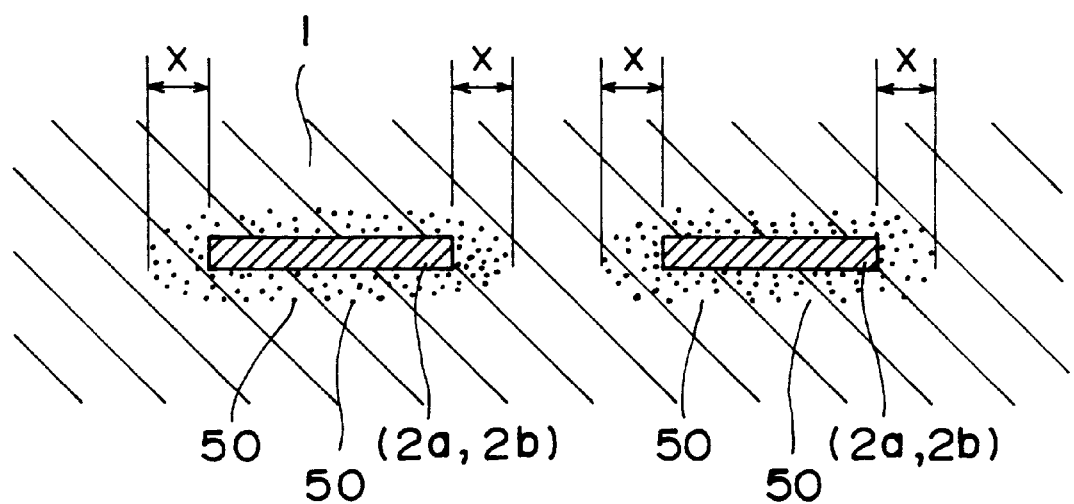
FIG. 2 is a diagram illustrating a state where copper is diffused in the wiring layer in the wiring board of the present invention.

Referring to FIG. 2, furthermore, copper in the surface wiring layer 2a and in the internal wiring layer 2b is partly diffused as designated at 50 in the surrounding ceramics constituting the insulating substrate 1 in the step of co-firing. In FIG. 2, the diffusion distance represented by x can be measured by using an X-ray microanalyzer (EPMA). That is, on the same plane, the distance is measured at 10 places from the end of the wiring layer 2a or 2b to the outermost part of the region in which copper element is detected, and an average value thereof is used to represent the diffusion distance. In the present invention, it is desired that the diffusion distance is set to be not larger than 20 μm and, particularly, not larger than 10 μm. When the diffusion distance exceeds 20 μm, the insulation decreases among the wiring layers and the reliability of the wiring board may decrease.

To set the diffusion distance to lie within the above-mentioned range, it is desired that the aluminum oxide crystal phase has an average particle diameter of not larger than 5.0 μm. When the crystal phase has an average particle diameter which is larger than 5.0 μm, the lengths of grain boundaries that serve as paths become short when copper is diffused in the ceramics and the rate of diffusion increases, making it difficult to set the diffusion distance to Lee within the above-mentioned range.

In the present invention, the diffusion distance of copper is set to lie within the above-mentioned range, whereby the insulation is effectively prevented from being dropped among the wiring layers. Accordingly, a minimum distance among the wiring layers formed in the same plane can be set to be smaller than, for example, 100 μm and, particularly, smaller than 90 μm, offering great advantage for forming fine wiring layers highly densely.

[Via-Hole Conductors 3]

In the present, the via-hole conductor 3 connecting the surface wiring layer 2a and the internal wiring layer 2b together or connecting the internal wiring layers 2b together, has the same composition as the above-mentioned surface wiring layer 2a or the internal wiring layer 2b, and has the structure in which the high-melting metal particles of W and Mo are diffused in the copper matrix like in these wiring layers. In particular, the via-hole conductor 3 is formed in the insulating substrate 1 and should desirably have the composition same as the internal wiring layer 2b.

It is further desired that the diffusion distance of copper in the via-hole conductor 3 into the surrounding ceramics is not larger than 20 μm and, particularly, not larger than 10 μm. Upon setting the diffusion distance to lie within the above-mentioned range, a drop in the insulation performance of the insulating substrate is effectively suppressed in the portions surrounding the via-hole conductor 3. When a plurality of via-hole conductors 3 are formed in the insulating substrate 1, in particular, the gap among the via-hole conductors 3 can be set to be smaller than 100 μm and, particularly, smaller than 90 μm, offering great advantage from the standpoint of highly densely forming fine wiring layers.

It is desired that the via-hole conductor 3 has a diameter of, usually, from about 50 to about 250 μm.

[Other Members]

The wiring board of the present invention having the above-mentioned structure is used being connected to other electronic parts and external circuits, and heat-generating members such as semiconductor elements may be included in the other electronic parts. Therefore, a metallized layer for connection is formed on the front surface or on the back surface of the insulating substrate 1 of the wiring board and, as required, thermal vias are formed for radiating the heat.

Figure 3:
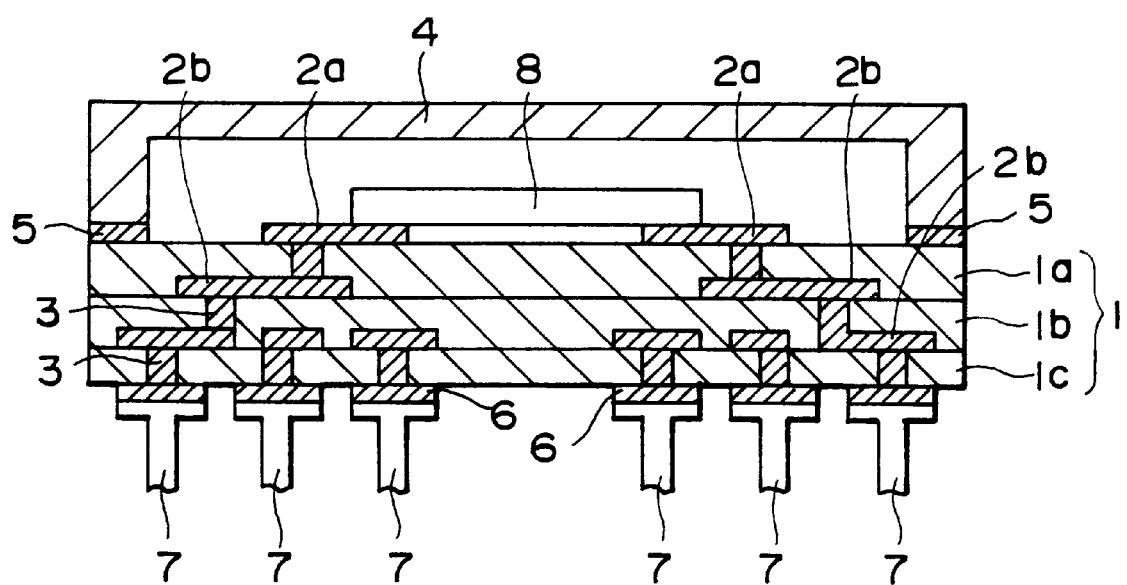
FIGS. 3 and 4 are sectional views illustrating a state of using the wiring board of the present invention.

In the wiring board of FIG. 3, for example, a semiconductor element 8 is mounted on the surface of the insulating substrate 1 of the structure shown in FIG. 1 so as to be connected to the surface wiring layer 2a and, besides, a closure 4 made of ceramics or a metal is secured thereto via a metallized layer 5 for sealing. The semiconductor element 8 is air-tightly sealed by the closure 4. Further, a metallized layer 6 for connection pads is formed on the back surface of the insulating substrate 1 so as to be conductive to the via-hole conductors 3. Lead pins 7 of an external circuit are connected and secured via the metallized layer 6. That is, the metallized layer 5 for sealing and the metallized layer 6 for connection pads correspond to the metallized layer for connection. A plated layer is usually formed on the surface of the metallized layer for connection, and the closure 4 and the lead pins 7 are connected to the metallized layer for connection via the plated layer.

In the present invention, it is desired that the metallized layer for connection contains the high-melting metal such as W or Mo in an amount of not smaller than 50% by volume, and contains a metal of the Group of iron in an amount of from 0.1 to 5% by volume and, particularly, from 0.5 to 2% by volume in terms of an oxide thereof.

That is, the metallized layer for connection must be strongly adhered to the insulating substrate 1 and must, hence, contain the high-melting metal (W, Mo) in an amount of not smaller than 50% by volume and, particularly, from 60 to 90% by volume. In the wiring board of the present invention, the surface wiring layer 2a and the internal wiring layer 2b are formed by being co-fired with the insulating substrate 1. Therefore, the firing temperature has been set to lie within a range which is as low as from 1200 to 1500° C. When the metallized layer for connection is constituted by the above-mentioned high-melting metal only, therefore, it becomes difficult to sinter the high-melting metal particles to a sufficient degree within the above-mentioned range of firing temperatures, and the metallized layer for connection is not formed by the co-firing. According to the present invention, a small amount of a metal of the Group of iron is contained in the metallized layer for connection to improve the sintering property at low temperatures. For example, when the content of a metal of the Group of irons is smaller than the above-mentioned range, a densely metallized layer is not formed by the firing at the above-mentioned low temperature, the sintering is not effected to a favorable degree, and the adhesion strength decreases between the metallized layer for connection and the insulating substrate 1. When the content of the metal of the Group of iron is not smaller than the above-mentioned range, on the other hand, the particles of W or Mo which is a high-melting metal grow to an abnormal degree. In this case, too, the adhesion strength decreases between the metallized layer for connection and the insulating substrate 1. In the present invention, examples of the metal of the Group of iron include Fe, Ni and Co. Among them, Ni is most preferred. The content of a metal of the Group of iron is calculated as an oxide. For example, the content of Fe is calculated as $Fe_2O_3$, the content of Ni is calculated as NiO, and the content of Co is calculated as $CO_3O_4$.

The metallized layer for connection may further contain aluminum oxide in an amount of not larger than 45% by volume and, particularly, from 2 to 35% by volume. This makes it possible to further increase the adhesion strength between the metallized layer for connection and the insulating substrate 1. When the content of aluminum oxide exceeds 45% by weight, the sintering becomes defective, and the plating tends to become missing (plating is not accomplished) in the step of plating. When the plating becomes missing, reliability drops in the adhesion to the closure 4 and to the lead pins 7.

Figure 4:
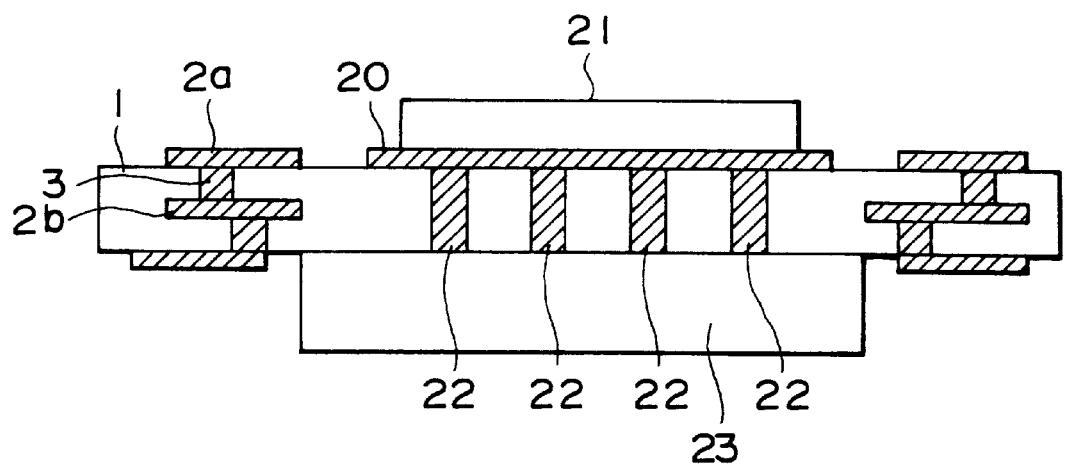

In the wiring board shown in FIG. 4, furthermore, a heat-generating element 21 such as a semiconductor element is mounted on the surface of the insulating substrate 1 having the above-mentioned wiring layers 2a, 2b and the via-hole conductor 3 either directly or via a conductor layer 20. Moreover, a plurality of thermal vias 22 are formed in the insulating substrate 1 penetrating from the front surface through up to the back surface, and a heat-radiating member 23 such as a heat sink 23 is provided on the back surface of the insulating substrate 1. That is, heat generated by the heat-generating element 21 is conducted to the thermal vias 22 either through the conductor layer 20 or directly, and is conducted to the heat-radiating member 23 through the thermal vias 22 so as to be radiated to the outer side.

In the present invention, the thermal vias 22 may have the same composition and the same diffusion structure as the above-mentioned surface wiring layer 2a or the internal wiring layer 2b. The thermal vias 22 having such a structure conduct heat favorably, exhibit favorable shape retentivity as described in connection with the wiring layers 2a, 2b, and can be formed by the co-firing. The thermal vias 22 should conduct heat favorably but require no electric property. Unlike the internal wiring layer 2b, therefore, the content of copper needs not be increased to be larger than that of the surface wiring layer 2a.

It is further desired that the above-mentioned thermal vias 22 have a diameter within a range of from 0.1 to 0.3 mm. When the diameter is smaller than 0.1 mm, the individual thermal vias 22 exhibit an increased thermal resistance, and the number of the thermal vias 22 must be increased, which is inconvenient. When the diameter is larger than 0.3 mm, on the other hand, copper melts in an increased amount during the firing, whereby copper elutes out of the thermal vias 22 and the thermal vias 22 may lose the shape retentivity.

It is desired that the conductor layer 22 formed as required has the same composition and the same diffusion structure as the above-mentioned metallized layer for connection.

According to the present invention described above, the design can be modified in a variety of ways. Referring to FIG. 1, for example, the insulating substrate is formed of three insulating layers 1a, 1b and 1c. However, the insulating substrate 1 may be constituted by two insulating layers or by one insulating layer. Or, the insulating substrate 1 may be formed of four or more insulating layers. When the insulating substrate 1 is constituted by one insulating layer, there is formed no internal wiring layer 2b.

(Preparation of the Wiring Board)

To prepare the wiring board of the present invention, first, a green sheet is prepared for forming the insulating substrate 1.

To prepare the green sheet, a powder of aluminum oxide, $MnO_2$, and as required, sintering assistants comprising a powder of $SiO_2$, MgO, CaO and SrO, as well as coloring components such as metal powders of W, Mo and Cr or oxides thereof, are mixed together at predetermined ratios in compliance with the structure of the above-mentioned insulating substrate 1. The thus mixed powder is then mixed with an organic binder and an organic solvent that have been known per se to prepare a slurry thereof which is then molded into a sheet having a predetermined thickness relying upon a known means such as doctor blade method, calender roll method, rolling method or press-molding method.

It is desired that the powder of aluminum oxide used for forming the green sheet has an average particle diameter of from 0.5 to 2.5 $\mu$m and, particularly, from 0.5 to 2.0 $\mu$m. When the average particle diameter is smaller than 0.5 $\mu$m, it becomes difficult to handle the powder and, besides, the cost increases. When the average particle diameter exceeds 2.5 $\mu$m, on the other hand, it becomes difficult to fire the powder at a temperature of not higher than 1500° C. Various oxide powders used for the preparation of the green sheet can be used in the form of carbonates, nitrates or acetates as far as they are capable of forming oxides upon the firing.

Separately from the preparation of the green sheet, the copper powder is blended with a high-melting metal powder such as of W or Mo and, as required, with a powder of a transition metal oxide other than W and Mo, a powder of aluminum oxide and a powder of an oxide of a metal of the Group of iron at ratios corresponding to the composition and the diffusion structure of the above-mentioned wiring layers 2a and 2b, and to which are further added an organic binder and an organic solvent, in order to prepare various conducting pastes for forming the surface wiring layer 2a, internal wiring layer 2b, via-hole conductors 3, metallized layer for connection and thermal vias 22.

Then, through-holes corresponding to the via-hole conductors 3 and to the thermal vias 22 are formed in the thus prepared green sheet in compliance with the structure of the desired wiring board by using a microdrill or a laser beam. The through-holes are filled with the conducing paste prepared as described above. The conducting paste is further applied to the front surface and the back surface of the green sheet in patterns corresponding to the surface wiring layer 2a, internal wiring layer 2b and metallized layer for connection relying on such a method as screen printing or gravure printing, thereby to form a sheet for forming insulating layers to constitute the insulating substrate 1.

The obtained insulating layer-forming sheet are positioned and are laminated one upon the other with the application of pressure depending upon the constitution of layers of the insulating substrate 1, and the laminate is fired at a temperature of from 1200 to 1500° C. and, particularly, from 1250 to 1400° C. to obtain a wiring board of the present invention comprising the insulating substrate 1 having the surface wiring layer 2a and the internal wiring layer 2b. When the desired insulating substrate 1 has a single-layer structure (comprises a piece of insulating layer), the insulating layer-forming sheet needs not be laminated with the application of pressure but may be simply fired.

In the present invention, when the firing temperature is lower than 1200° C., the insulating layer-forming sheet chiefly comprising the aluminum oxide fails to acquire a relative density of not smaller than 95%, and the obtained insulating substrate 1 loses thermal conductivity and strength. When the firing temperature is higher than 1500° C., on the other hand, W and Mo in the conducting paste are sintered, whereby the diffusion structure loses uniformity in the wiring layers 2a, 2b, via-hole conductors 3, metallized layer for connection and thermal vias 22, and the shape retentivity decreases. Besides, the wiring layers 2a, 2b and the via-hole conductors 3 exhibit increased electric resistances making it difficult to lower the sheet resistance to be smaller than 8 milliohms/□. Moreover, the aluminum oxide crystal phase in the insulating substrate 1 acquires an increased average particle diameter or grows abnormally, resulting in a decrease in the lengths of the grain boundaries that serve as paths for copper to diffuse in the ceramics and, hence, resulting in an increase in the diffusion velocity, making it difficult to suppress the diffusion distance of copper to be not longer than 20 μm.

It is further desired that the firing is conducted in a nonoxidizing atmosphere such as of nitrogen or a mixture atmosphere of nitrogen and hydrogen. To suppress the diffusion distance of copper to be not larger than 20 μm, furthermore, it is desired that the firing is effected in a nonoxidizing atmosphere containing nitrogen and hydrogen and having a dew point of not higher than +30° C. and, particularly, not higher than −25° C. When the dew point during the firing is higher than the above-mentioned range, moisture in the atmosphere reacts with ceramic components to form an oxide film during the firing, whereby the oxide film reacts with copper present in the wiring layers. Accordingly, the wiring layers exhibit increased resistances and, besides, diffusion of copper into the ceramics is promoted.

In the thus obtained wiring board, the insulating substrate 1 exhibits very smoothly fired surface having a surface coarseness Ra (JIS B-0601) of not larger than 1 μm and, particularly, not larger than 0.7 μm. As a result, the surface of the insulating substrate 1 needs not be subjected to the after-treatment such as polishing, offering a great advantage from the standpoint of mass production and cost of production.

In the wiring board of the present invention, the connection terminals such as of Fe—Ni—Co, Cu or Cu—W and a metal fitting such as heat sink, can be attached to the surface wiring layer 2a, to the metallized layer 5 for sealing and to the metallized layer for connection such as metallized layer 6 for connection pads in a manner as described below. That is, a plated layer comprising an Ni-plated layer and an Au-plated layer formed thereon and having a total thickness of from 1.5 to 5 μm is formed on the surface of the surface wiring layer 2a or on the metallized layer for connection relying on the nonelectrolytic plating method or the electrolytic plating method and, then, the metal fitting is attached by using a brazing material such as Ag—Cu, Au—Sn or Ag—Cu—Ti from the standpoint of enhancing the junction strength. In general, the Ni-plated layer has a thickness of from 1 to 3 μm and the Au-plated layer has a thickness of from 0.5 to 2 μm. When the Ag—Cu brazing material is used, in particular, it is desired that the Ni-plated layer has a thickness of not smaller than 1 μm to protect the surface wiring layer 2a or the metallized layer for connection, since the brazing material is reactive with the surface wiring layer 2a or the metallized layer for connection.

The thus formed wiring board of the present invention exhibits a good thermal conductivity, satisfies the above-mentioned thermal requirement and in which the surface wiring layer and the internal wiring layer exhibit sheet resistances of not larger than 8 milliohms/□ and, particularly, not larger than 6 milliohms/□ satisfying the above-mentioned electrical requirement. Therefore, the wiring board of the present invention is very useful for the semiconductor devices that execute arithmetic operations at high speeds.

EXAMPLES

[Experiment 1]

$MnO_2$ was added to a powder of aluminum oxide (average particle diameter of 1.8 μm) at ratios shown in Tables 1 and 2, followed by the addition of 3% by weight of $SiO_2$ and 0.5% by weight of MgO, and to which were further added an acrylic binder and toluene (solvent) to prepare slurries. By using these slurries, green sheets having a thickness of 250 μm were formed by the doctor blade method. Through-holes having a diameter of 120 μm were formed in the sheets at predetermined places.

Next, a copper powder having an average particle diameter of 5 μm and a tungsten powder or a molybdenum powder having an average particle diameter of from 0.8 to 12 μm were mixed together at ratios shown in Tables 1 and 2 followed by the addition of acrylic binder and acetone, to prepare conducting pastes.

The conducting pastes were applied by printing onto the green sheets, and the through-holes in the green sheets were filled with the conducting pastes. The thus obtained sheets were positioned and laminated one upon the other with the application of pressure. The laminate (having 4 layers) was dewaxed in an oxygen-containing atmosphere ($N_2+O_2$ or open atmosphere) without substantially containing water, and was fired in an nitrogen/hydrogen mixture atmosphere having a dew point of −10° C. at temperatures shown in Tables 1 and 2.

The relative densities of the insulating substrates in the thus prepared wiring boards were measured by the Archimedes' method, and their thermal conductivities (3 mm thick) and the volume resistivities were measured by the laser flash method.

Further, the surface wiring layers of the wiring boards were measured for their resistances, lengths, widths and thicknesses, and sheet resistances (milliohms/□) were calculated as a conductor having a thickness of 15 μm. Moreover, the texture of the surface wiring layer was observed by using a scanning-type electron microscope to measure the particle diameters of the tungsten and/or the molybdenum particles in the surface wiring layers. The results were as shown in Tables 1 and 2. Appearance of the wiring boards was inspected concerning the oozing of the surface wiring layers and peeling of the surface wiring layers. The results were as shown in Tables 1 and 2.

TABLE 1

| Sample No. | Amount of $MnO_2$ in the insulating substrate (% by wt.) | Surface wiring layer composition (% by vol.) Cu W, Mo | Firing temp. (° C.) | Insulating substrate | | | Surface wiring layer | | |
|---|---|---|---|---|---|---|---|---|---|
| | | | | Relative density (%) | Thermal conductivity (W/mK) | Vol. specific resistivity | W, Mo particle diameter (μm) | Sheet resistance (mΩ/□) | Appearance |
| *1 | 1.5 | 50 W 50 | 1300 | 94 | 8 | $10^{10}$ | 1.5 | 5 | good |
| 2 | 2 | 50 W 50 | 1300 | 95 | 15 | $>10^{14}$ | 1.5 | 4 | good |
| 3 | 3 | 50 W 50 | 1300 | 98 | 17 | $>10^{14}$ | 1.5 | 4 | good |

TABLE 1-continued

| Sample No. | Amount of MnO$_2$ in the insulating substrate (% by wt.) | Surface wiring layer composition (% by vol.) Cu / W, Mo | | Firing temp. (°C.) | Insulating substrate Relative density (%) | Thermal conductivity (W/mK) | Vol. specific resistivity | Surface wiring layer W, Mo particle diameter (μm) | Sheet resistance (mΩ/□) | Appearance |
|---|---|---|---|---|---|---|---|---|---|---|
| 4  | 3.5 | 50 | W 50 | 1300 | 99 | 19 | >10$^{14}$ | 1.5 | 4 | good |
| 5  | 5   | 50 | W 50 | 1300 | 99 | 19 | >10$^{14}$ | 1.5 | 4 | good |
| 6  | 6   | 50 | W 50 | 1300 | 99 | 19 | >10$^{14}$ | 1.5 | 4 | good |
| 7  | 7   | 50 | W 50 | 1300 | 99 | 20 | >10$^{14}$ | 1.5 | 4 | good |
| 8  | 10  | 50 | W 50 | 1250 | 99 | 19 | >10$^{14}$ | 1.4 | 4 | good |
| *9 | 12  | 50 | W 50 | 1250 | 99 | 20 | 10$^{10}$  | 1.4 | 4 | good |
| *10| 4   | 0  | W 100| 1300 | 99 | 18 | >10$^{14}$ | 1.2 | 20 | good |
| *11| 4   | 5  | W 95 | 1300 | 99 | 18 | >10$^{14}$ | 1.3 | 10 | good |
| 12 | 4   | 10 | W 90 | 1300 | 99 | 18 | >10$^{14}$ | 1.4 | 7 | good |
| 13 | 4   | 20 | W 80 | 1300 | 99 | 18 | >10$^{14}$ | 1.5 | 7 | good |
| 14 | 4   | 30 | W 70 | 1300 | 99 | 18 | >10$^{14}$ | 1.5 | 6 | good |
| 15 | 4   | 50 | W 50 | 1300 | 99 | 18 | >10$^{14}$ | 1.5 | 4 | good |
| 16 | 4   | 60 | W 40 | 1300 | 99 | 18 | >10$^{14}$ | 2.0 | 4 | good |
| 17 | 4   | 70 | W 30 | 1300 | 99 | 18 | >10$^{14}$ | 2.0 | 4 | good |
| *18| 4   | 75 | W 25 | 1300 | 99 | 18 | >10$^{14}$ | 2.5 | 9 | oozed, peeled |
| 19 | 4   | 40 | Mo 60 | 1300 | 99 | 18 | >10$^{14}$ | 1.5 | 4 | good |
| 20 | 4   | 50 | Mo 50 | 1300 | 99 | 18 | >10$^{14}$ | 1.5 | 4 | good |
| 21 | 4   | 60 | Mo 40 | 1300 | 99 | 18 | >10$^{14}$ | 2.0 | 3 | good |
| 22 | 4   | 50 | Mo, W 50 | 1300 | 99 | 18 | >10$^{14}$ | 1.5 | 4 | good |
| 23 | 4   | 60 | Mo, W 40 | 1300 | 99 | 18 | >10$^{14}$ | 2.0 | 3 | good |

Samples marked with * lie outside the scope of the invention.

TABLE 2

| Sample No. | Amount of MnO$_2$ in the insulating substrate (% by wt.) | Surface wiring layer composition (% by vol.) Cu / W, Mo | | Firing temp. (°C.) | Insulating substrate Relative density (%) | Thermal conductivity (W/mK) | Vol. specific resistivity | Surface wiring layer W, Mo particle diameter (μm) | Sheet resistance (mΩ/□) | Appearance |
|---|---|---|---|---|---|---|---|---|---|---|
| *24 | 4 | 50 | 50 | 1150 | 92 | 8  | 10$^{10}$  | 0.8  | 9 | good |
| 25  | 4 | 50 | 50 | 1200 | 95 | 15 | >10$^{14}$ | 1.0  | 4 | good |
| 26  | 4 | 50 | 50 | 1250 | 98 | 16 | >10$^{14}$ | 1.2  | 4 | good |
| 27  | 4 | 50 | 50 | 1350 | 99 | 19 | >10$^{14}$ | 3.0  | 4 | good |
| 28  | 4 | 50 | 50 | 1400 | 99 | 19 | >10$^{14}$ | 4.0  | 5 | good |
| 29  | 4 | 50 | 50 | 1450 | 99 | 19 | >10$^{14}$ | 6.0  | 6 | good |
| 30  | 4 | 50 | 50 | 1500 | 99 | 20 | >10$^{14}$ | 9.0  | 7 | good |
| *31 | 4 | 50 | 50 | 1550 | 99 | 20 | >10$^{14}$ | 12.0 | 9 | oozed |

Samples marked with * lie outside the scope of the invention.

In the case of a sample No. 1 containing less than 2% by weight of MnO$_2$ in the insulating substrate as shown in Tables 1 and 2, the insulating substrate was not sintered to a sufficient degree, exhibited poor thermal conductivity and poor insulating property, and could not be used as the wiring board. In the case of a sample No. 9 which contained more than 10% by weight of MnO$_2$, the MnO$_2$ was reduced, and the substrate exhibited poor insulating property and decreased strength.

In the case of samples Nos. 10 and 11 containing less than 10% by volume of copper in the wiring layer composition, the sheet resistance was larger than 8 milliohms/□. In the case of the sample No. 18 containing more than 70% by volume of copper, the wiring exhibited poor shape retentivity, the texture became nonuniform, the sheet resistance was larger than 8 milliohms/□, and the surface wiring layer oozed and partly peeled.

In the case of a sample No. 24 co-fired at a temperature of lower than 1200° C., the relative density could not be increased to be not lower than 95% and the thermal conductivity was decreased. In the case of a sample No. 31 co-fired at a temperature of higher than 1500° C., the average particle diameter became larger than 10 μm due to tungsten that was sintered and coagulated, and copper floated on the surface and the wiring oozed.

According to the wiring boards of the present invention in contrast with these comparative examples, the insulating substrate possessed a relative density of 95% and a thermal conductivity of not smaller than 10 W/M·K, without causing the surface wiring layer to be oozed or peeled, making it possible to form the surface wiring layer having a sheet resistance of as small as 8 milliohms/□ or less through the co-firing.

In the wiring board of the present invention, the distances were measured at 10 places from an end of the wiring layer through up to the outermost region where copper could be detected on the same plane relying on the EPMA (X-ray microanalyzer) analysis. A favorable diffusion distance of not longer than 20 μm in average was exhibited by the wiring layers.

[Experiment 2-1]

A green sheet having through-holes was prepared in the same manner as in Experiment 1 but using the $MnO_2$ powder at ratios shown in Tables 3 and 4.

Next, a copper powder having an average particle diameter of 5 μm, a tungsten powder or a molybdenum powder having an average particle diameter of from 0.8 to 12 μm, an NiO powder having an average particle diameter of 1 μm, and an $Al_2O_3$ powder having an average particle diameter of 0.5 μm were mixed together at ratios shown in Tables 3 and 4, and to which an acrylic binder and acetone were added to prepare conducting pastes.

The conducting pastes were applied by printing onto the green sheets in the shape of a wiring pattern, and were charged into the through-holes. Then, laminates were prepared in the same manner as in Experiment 1 and were fired at temperatures shown in Tables 3 and 4 in an nitrogen/hydrogen mixture atmosphere having a dew point of −10° C. to obtain wiring boards.

The wiring boards were evaluated in the same manner as in Experiment 1. The results were as shown in Tables 5 and 6.

On the surface wiring layer measuring 2 mm×20 mm were further formed an Ni-plated layer maintaining a thickness of 2 μm and an Au-plated layer maintaining a thickness of 1 μm, and onto which was brazed an L-shaped lead of Fe—Ni—Co by using a brazing material of Au—Sn. Then, the metal fitting was pulled in the vertical direction to measure the strength (kgf) at the time when the metal fitting was removed. The results were as shown in Tables 5 and 6.

TABLE 3

| Sample No. | Amount of $MnO_2$ in the insulating substrate (% by wt.) | Surface wiring layer composition | | | | Firing temp. (° C.) |
|---|---|---|---|---|---|---|
| | | Main conductor component composition (% by vol.) | | Other component (parts by vol.) note 1) | | |
| | | Cu | W, Mo | Transition metal | $Al_2O_3$ | |
| 1 | 4 | 50 | W 50 | — | 0.5 | 1300 |
| 2 | 4 | 50 | W 50 | — | 5.0 | 1300 |
| 3 | 4 | 50 | W 50 | NiO 0.005 | — | 1300 |
| 4 | 4 | 50 | W 50 | NiO 0.01 | — | 1300 |
| 5 | 4 | 50 | W 50 | NiO 0.01 | 0.5 | 1300 |
| 6 | 4 | 50 | W 50 | NiO 0.1 | — | 1300 |
| 7 | 4 | 50 | W 50 | NiO 0.1 | 1.0 | 1300 |
| 8 | 4 | 50 | W 50 | NiO 0.5 | — | 1300 |
| 9 | 4 | 50 | W 50 | NiO 1.0 | — | 1300 |
| 10 | 4 | 50 | W 50 | NiO 3.0 | — | 1300 |
| 11 | 4 | 50 | W 50 | NiO 5.0 | — | 1300 |
| 12 | 4 | 50 | W 50 | NiO 5.0 | 0.5 | 1300 |
| 13 | 4 | 50 | W 50 | NiO 6.0 | — | 1300 |
| 14 | 1.5 | 50 | W 50 | NiO 1.0 | — | 1300 |
| 15 | 2 | 50 | W 50 | NiO 1.0 | — | 1300 |
| 16 | 3 | 50 | W 50 | NiO 1.0 | — | 1300 |
| 17 | 4 | 50 | W 50 | NiO 1.0 | — | 1300 |
| 18 | 5 | 50 | W 50 | NiO 1.0 | — | 1300 |
| 19 | 6 | 50 | W 50 | NiO 1.0 | — | 1300 |
| 20 | 4 | 0 | W 100 | NiO 1.0 | 0.5 | 1300 |
| 21 | 4 | 5 | W 95 | NiO 1.0 | 0.5 | 1300 |
| 22 | 4 | 10 | W 90 | NiO 1.0 | 0.5 | 1300 |
| 23 | 4 | 20 | W 80 | NiO 1.0 | 0.5 | 1300 |
| 24 | 4 | 30 | W 70 | NiO 1.0 | 0.5 | 1300 |
| 25 | 4 | 50 | W 50 | NiO 1.0 | 0.5 | 1300 |
| 26 | 4 | 60 | W 40 | NiO 1.0 | 0.5 | 1300 |
| 27 | 4 | 70 | W 30 | NiO 1.0 | 0.5 | 1300 |
| 28 | 4 | 75 | W 25 | NiO 1.0 | 0.5 | 1300 |

Note 1) The amounts of other components are ratios (parts by vol.) with respect to 100 parts by volume of the main conductor component.

TABLE 4

| Sample No. | Amount of $MnO_2$ in the insulating substrate (% by wt.) | Surface wiring layer composition | | | | Firing temp. (° C.) |
|---|---|---|---|---|---|---|
| | | Main conductor component composition (% by vol.) | | Other component (parts by vol.) note 1) | | |
| | | Cu | W, Mo | Transition metal | $Al_2O_3$ | |
| 29 | 4 | 40 | Mo 60 | NiO 1.0 | 0.5 | 1300 |
| 30 | 4 | 50 | Mo 50 | NiO 1.0 | 0.5 | 1300 |
| 31 | 4 | 60 | Mo 40 | NiO 1.0 | 0.5 | 1300 |

TABLE 4-continued

| Sample No. | Amount of MnO$_2$ in the insulating substrate (% by wt.) | Surface wiring layer composition | | | | Firing temp. (° C.) |
|---|---|---|---|---|---|---|
| | | Main conductor component composition (% by vol.) | | Other component (parts by vol.) note 1) | | |
| | | Cu | W, Mo | Transition metal | Al$_2$O$_3$ | |
| 32 | 4 | 50 | W, Mo 50 | NiO 1.0 | 0.5 | 1300 |
| 33 | 4 | 60 | W, Mo 40 | NiO 1.0 | 0.5 | 1300 |
| 34 | 4 | 50 | W 50 | NiO 1.0 | 0.5 | 1150 |
| 35 | 4 | 50 | W 50 | NiO 1.0 | 0.5 | 1200 |
| 36 | 4 | 50 | W 50 | NiO 1.0 | 0.5 | 1250 |
| 37 | 4 | 50 | W 50 | NiO 1.0 | 0.5 | 1350 |
| 38 | 4 | 50 | W 50 | NiO 1.0 | 0.5 | 1400 |
| 39 | 4 | 50 | W 50 | NiO 1.0 | 0.5 | 1450 |
| 40 | 4 | 50 | W 50 | NiO 1.0 | 0.5 | 1500 |

Note 1) The amounts of other components are ratios (parts by vol.) with respect to 100 parts by volume of the main conductor component.

TABLE 5

| Sample No. | Insulating substrate | | | Surface wiring layer | | | |
|---|---|---|---|---|---|---|---|
| | Relative density (%) | Thermal conductivity (W/mK) | Vol. specific resistivity (Ωcm) | W, Mo particle diameter (μm) | Sheet resistance (mΩ/□) | Adhesion strength (kgf) | Appearance |
| 1 | 99 | 18 | >10$^{14}$ | 1.5 | 5 | 1 | good |
| 2 | 99 | 18 | >10$^{14}$ | 1.5 | 12 | 5 | good |
| 3 | 99 | 18 | >10$^{14}$ | 1.5 | 3 | <1 | good |
| 4 | 99 | 18 | >10$^{14}$ | 1.5 | 3 | 3 | good |
| 5 | 99 | 18 | >10$^{14}$ | 1.5 | 4 | 3 | good |
| 6 | 99 | 18 | >10$^{14}$ | 1.5 | 4 | 4 | good |
| 7 | 99 | 18 | >10$^{14}$ | 1.5 | 5 | 4 | good |
| 8 | 99 | 18 | >10$^{14}$ | 1.5 | 5 | 4 | good |
| 9 | 99 | 18 | >10$^{14}$ | 1.5 | 5 | 4 | good |
| 10 | 99 | 18 | >10$^{14}$ | 1.5 | 6 | 4 | good |
| 11 | 99 | 18 | >10$^{14}$ | 1.5 | 7 | 4 | good |
| 12 | 99 | 18 | >10$^{14}$ | 1.5 | 8 | 4 | good |
| 13 | 99 | 18 | >10$^{14}$ | 1.5 | 10 | 3 | good |
| 14 | 94 | 8 | 10$^{10}$ | 1.5 | 5 | 2 | good |
| 15 | 95 | 15 | >10$^{14}$ | 1.5 | 4 | 4 | good |
| 16 | 98 | 17 | >10$^{14}$ | 1.5 | 4 | 4 | good |
| 17 | 99 | 19 | >10$^{14}$ | 1.5 | 4 | 4 | good |
| 18 | 99 | 19 | >10$^{14}$ | 1.5 | 4 | 4 | good |
| 19 | 99 | 19 | >10$^{14}$ | 1.5 | 4 | 4 | good |
| 20 | 99 | 18 | >10$^{14}$ | 0.8 | 20 | <1 | good |
| 21 | 99 | 18 | >10$^{14}$ | 0.9 | 10 | <1 | good |
| 22 | 99 | 18 | >10$^{14}$ | 1.0 | 8 | 3 | good |
| 23 | 99 | 18 | >10$^{14}$ | 1.2 | 8 | 4 | good |
| 24 | 99 | 18 | >10$^{14}$ | 1.3 | 7 | 4 | good |
| 25 | 99 | 18 | >10$^{14}$ | 1.5 | 5 | 5 | good |
| 26 | 99 | 18 | >10$^{14}$ | 1.5 | 5 | 5 | good |
| 27 | 99 | 18 | >10$^{14}$ | 1.5 | 5 | 5 | good |
| 28 | 99 | 18 | >10$^{14}$ | 1.8 | 10 | 5 | oozed & peeled |

TABLE 6

| Sample No. | Insulating substrate | | | Surface wiring layer | | | |
|---|---|---|---|---|---|---|---|
| | Relative density (%) | Thermal conductivity (W/mK) | Vol. specific resistivity (Ωcm) | W, Mo particle diameter (μm) | Sheet resistance (mΩ/□) | Adhesion strength (kgf) | Appearance |
| 29 | 99 | 18 | >10$^{14}$ | 1.5 | 4 | 4 | good |
| 30 | 99 | 18 | >10$^{14}$ | 1.5 | 4 | 4 | good |
| 31 | 99 | 18 | >10$^{14}$ | 1.5 | 4 | 4 | good |

TABLE 6-continued

| | Insulating substrate | | | Surface wiring layer | | | |
|---|---|---|---|---|---|---|---|
| Sample No. | Relative density (%) | Thermal conductivity (W/mK) | Vol. specific resistivity (Ωcm) | W, Mo particle diameter (μm) | Sheet resistance (mΩ/□) | Adhesion strength (kgf) | Appearance |
| 32 | 99 | 18 | >$10^{14}$ | 1.5 | 4 | 4 | good |
| 33 | 99 | 18 | >$10^{14}$ | 1.5 | 4 | 4 | good |
| 34 | 92 | 8 | $10^{10}$ | 0.8 | 9 | 1 | good |
| 35 | 95 | 15 | >$10^{14}$ | 1.0 | 4 | 3 | good |
| 36 | 97 | 16 | >$10^{14}$ | 1.3 | 4 | 3 | good |
| 37 | 99 | 19 | >$10^{14}$ | 3.0 | 5 | 5 | good |
| 38 | 99 | 19 | >$10^{14}$ | 4.0 | 5 | 5 | good |
| 39 | 99 | 19 | >$10^{14}$ | 5.0 | 6 | 5 | good |
| 40 | 99 | 20 | >$10^{14}$ | 9.0 | 7 | 5 | good |

Note 1) The amounts of other components are ratios (parts by weight) with respect to 100 parts by volume of the main conductor component.

In the case of samples Nos. 1 and 3 containing a transition metal in an amount of less than 0.01 part by volume in the surface wiring layer as shown in Tables 3 to 6, the surface wiring layer did not possess a sufficiently large adhesion strength. In the case of a sample No. 2 to which 5 parts by volume of $Al_2O_3$ was added, the adhesion strength increased but the sheet resistance of the wiring layer increased, too. In the case of a sample No. 13 containing larger than 5% by volume of a transition metal, the sheet resistance of the surface wiring layer became larger than 8 milliohms/□, and the wiring layer of a small resistance could not be formed.

In the case of a sample No. 14 containing $MnO_2$ in a small amount and having a relative density of lower than 95%, the thermal conductivity was smaller than 10 W/M·K, and the adhesion strength of the surface wiring layer has dropped, too. In the case of samples Nos. 20 and 21 containing smaller than 10% by volume of copper in the surface wiring layer, the sheet resistance was larger than 8 milliohms/□. In the case of a sample No. 28 containing copper in an amount of more than 70% by volume, the texture was nonuniform, the sheet resistance was larger than 8 milliohms/□, the wiring exhibited poor shape retentivity, and the surface wiring layer oozed and partly peeled.

In the wiring boards (samples Nos. 4 to 12, 15 to 19, 22 to 27, 29 to 33, 35 to 40) having the surface wiring layer containing a transition metal in predetermined amounts, in contrast with the above samples, the surface wiring layer could be formed having a sheet resistance of not larger than 8 milliohms/□, and an adhesion strength of not smaller than 3 kgf with respect to the insulating substrate.

[Experiment 2-2]

To the aluminum oxide powder (average particle size of 1.8 μm) were added 4% by weight of $MnO_2$, 3% by weight of $SiO_2$ and 0.5% by weight of MgO, and to which were further added an acrylic binder and toluene to prepare a slurry, from which a green sheet having a thickness of 250 μm was prepared by the doctor blade method. Then, through-holes having a diameter of 120 μm were formed in the green sheet at predetermined places.

Next, to 100 parts by volume of the main conductor component comprising 50% by volume of a copper powder having an average particle diameter of 5 μm and 50% by volume of a tungsten powder having an average particle diameter of 1 μm, there were added oxide powders of $TiO_2$, $Cr_2O_3$, $Fe_2O_3$, NiO, $Nb_2O_5$ and $MnO_2$ having an average particle diameter of 1 μm shown in Tables 7 and 8 in an amount of from 0.5 to 7 parts by volume in terms of a metal, and, for some samples, an $Al_2O_3$ powder having an average particle diameter of 0.5 μm in amounts as shown in Tables 7 and 8, followed by the addition of an acrylic binder and acetone, thereby to prepare conducting pastes.

The conducting pastes were applied by printing onto the green sheets and were also charged into the through-holes in the sheets. The thus prepared sheets were positioned and laminated with the application of pressure to prepare a laminate of 4 layers. Thereafter, the laminate was dewaxed in an oxygen-containing atmosphere ($N_2+O_2$ or open air) without substantially containing moisture, and was fired at 1300° C. in an nitrogen/hydrogen mixture atmosphere having a dew point of −10° C.

The insulating substrates in the thus prepared wiring boards all exhibited relative densities of not smaller than 99%, and thermal conductivities (3 mm thick) of 18 W/M·K as measured by the laser flush method and volume resistivities of not smaller than $10^{14}$ MΩ·□.

The surface wiring layers of the wiring boards were measured for their sheet resistances, lengths, widths and thicknesses, and from which a sheet resistance (milliohms/□) was operated being converted into a conductor of a thickness of 15 μm. The texture was observed by using a scanning-type electron microscope to measure the particle diameters of tungsten particles in the surface wiring layer. Further, the junction strength of the metal fitting was measured in the same manner as in Experiment 2-1. The results of measurement were as shown in Tables 7 and 8.

TABLE 7

| | Surface wiring layer composition | | Surface wiring layer | | | |
|---|---|---|---|---|---|---|
| Sample No. | Other component (parts by vol) note 1) | | W, Mo particle diameter (μm) | Sheet resistance (mΩ/□) | Metal fitting junction strength (kgf) | Appearance |
| | Transition metal | $Al_2O_3$ | | | | |
| 41 | $TiO_2$ 0.5 | — | 1.5 | 5 | 4 | good |
| 42 | $TiO_2$ 1.0 | — | 1.5 | 5 | 4 | good |
| 43 | $TiO_2$ 3.0 | — | 1.5 | 6 | 4 | good |

TABLE 7-continued

| Sample No. | Surface wiring layer composition | | | Surface wiring layer | | |
|---|---|---|---|---|---|---|
| | Other component (parts by vol) note 1) | | W, Mo particle diameter ($\mu$m) | Sheet resistance (m$\Omega$/□) | Metal fitting junction strength (kgf) | Appearance |
| | Transition metal | $Al_2O_3$ | | | | |
| 44 | $TiO_2$ | 5.0 | — | 1.5 | 7 | 4 | good |
| 45 | $TiO_2$ | 7.0 | — | 1.7 | 10 | 3 | good |
| 46 | $TiO_2$ | 3.0 | 0.1 | 1.5 | 6 | 5 | good |
| 47 | $TiO_2$ | 5.0 | 0.2 | 1.5 | 8 | 5 | good |
| 48 | $Co_3O_4$ | 0.5 | — | 1.5 | 5 | 4 | good |
| 49 | $Co_3O_4$ | 1.0 | — | 1.7 | 5 | 4 | good |
| 50 | $Co_3O_4$ | 3.0 | — | 2.0 | 6 | 4 | good |
| 51 | $Co_3O_4$ | 5.0 | — | 2.5 | 7 | 4 | good |
| 52 | $Co_3O_4$ | 7.0 | — | 3.0 | 11 | 3 | good |
| 53 | $Co_3O_4$ | 3.0 | 0.1 | 2.0 | 6 | 4 | good |
| 54 | $Co_3O_4$ | 5.0 | 0.2 | 2.5 | 8 | 5 | good |
| 55 | $Cr_2O_3$ | 0.5 | — | 1.5 | 5 | 3 | good |
| 56 | $Cr_2O_3$ | 1.0 | — | 1.5 | 5 | 4 | good |
| 57 | $Cr_2O_3$ | 3.0 | — | 1.5 | 6 | 4 | good |
| 58 | $Cr_2O_3$ | 5.0 | — | 1.5 | 7 | 4 | good |
| 59 | $Cr_2O_3$ | 7.0 | — | 1.5 | 10 | 4 | good |
| 60 | $Cr_2O_3$ | 3.0 | 0.1 | 1.5 | 6 | 4 | good |
| 61 | $Cr_2O_3$ | 5.0 | 0.2 | 1.5 | 8 | 5 | good |
| 62 | $Fe_2O_3$ | 0.5 | — | 1.5 | 6 | 3 | good |
| 63 | $Fe_2O_3$ | 1.0 | — | 1.8 | 6 | 3 | good |
| 64 | $Fe_2O_3$ | 3.0 | — | 2.0 | 6 | 4 | good |
| 65 | $Fe_2O_3$ | 5.0 | — | 2.6 | 7 | 4 | good |
| 66 | $Fe_2O_3$ | 7.0 | — | 3.3 | 11 | 3 | good |
| 67 | $Fe_2O_3$ | 3.0 | 0.1 | 2.0 | 6 | 4 | good |
| 68 | $Fe_2O_3$ | 5.0 | 0.2 | 2.6 | 8 | 5 | good | note 1) The amounts of other components are ratios (parts by vol) with respect to 100 parts by volume of the main conductor component.

TABLE 8

| Sample No. | Surface wiring layer composition | | | Surface wiring layer | | |
|---|---|---|---|---|---|---|
| | Other component (parts by vol) note 1) | | W, Mo particle diameter ($\mu$m) | Sheet resistance (m$\Omega$/□) | Metal fitting junction strength (kgf) | Appearance |
| | Transition metal | $Al_2O_3$ | | | | |
| 69 | $Nb_2O_5$ | 0.5 | — | 1.5 | 5 | 3 | good |
| 70 | $Nb_2O_5$ | 1.0 | — | 1.5 | 5 | 3 | good |
| 71 | $Nb_2O_5$ | 3.0 | — | 1.5 | 6 | 4 | good |
| 72 | $Nb_2O_5$ | 5.0 | — | 1.5 | 7 | 4 | good |
| 73 | $Nb_2O_5$ | 7.0 | — | 1.5 | 10 | 4 | good |
| 74 | $Nb_2O_5$ | 3.0 | 0.1 | 1.5 | 6 | 4 | good |
| 75 | $Nb_2O_5$ | 5.0 | 0.2 | 1.5 | 8 | 4 | good |
| 76 | $MnO_2$ | 0.5 | — | 1.5 | 5 | 4 | good |
| 77 | $MnO_2$ | 1.0 | — | 1.5 | 5 | 4 | good |
| 78 | $MnO_2$ | 3.0 | — | 1.6 | 5 | 4 | good |
| 79 | $MnO_2$ | 5.0 | — | 1.7 | 7 | 4 | good |
| 80 | $MnO_2$ | 7.0 | — | 1.8 | 9 | 4 | good |
| 81 | $MnO_2$ | 3.0 | 0.1 | 1.6 | 6 | 4 | good |
| 82 | $MnO_2$ | 5.0 | 0.2 | 1.7 | 8 | 5 | good | note 1) The amounts of other components are ratios (parts by vol) with respect to 100 parts by volume of the main conductor component.

As will be obvious from the results of Tables 7 and 8, even when $TiO_2$, $Cr_2O_3$, $Co_3O_4$, $Fe_2O_3$, $Nb_2O_5$ and $MnO_2$ were added in suitable amounts, improvement in the adhesion strength of the surface wiring layer to the insulating substrate was confirmed compared to when they were not added (sample No. 1 in Experiment 2). When the amount exceeded 5 parts by volume, however, a drop in the sheet resistance was recognized. The surface wiring layers all exhibited an adhesion strength of not smaller than 3 kgf, but were not at all oozed or peeled.

[Experiment 3]

Green sheets having through-holes were prepared in the same manner as in Experiment 1 but using the $MnO_2$ powder at ratios shown in Tables 9 and 10.

Next, a copper powder having an average particle diameter of 5 $\mu$m, and a tungsten powder or a molybdenum powder having an average particle diameter of from 0.8 to 12 μm were mixed together at ratios shown in Tables 9 and 10 (ratios in the whole amount of solid components), and to which were further added an acrylic binder and acetone to prepare conducting pastes for wiring layers.

On the other hand, $Fe_2O_3$, NiO, $Co_3O_4$ and alumina were mixed together at ratios shown in Tables 9 and 10 (ratios in the whole amount of solid components), and to which were further added an acrylic binder and acetone to prepare conducting pastes for a metallized layer for connection.

The conducting pastes for the wiring layers and the conducting pastes for the metallized layers for connection were applied by printing onto predetermined portions of the green sheets. The conducting pastes for the wiring layers were also charged into the through holes in the sheets. The thus prepared sheets were positioned and laminated with the application of pressure to prepare a laminate of 4 layers. Thereafter, the laminate was dewaxed in an oxygen-containing atmosphere ($N_2+O_2$ or open air) without substantially containing moisture, and was fired at temperatures shown in Tables 9 and 10 in an nitrogen/hydrogen mixture atmosphere having a dew point of −10° C. to obtain a wiring board having a metallized layer for connection formed on the surface thereof.

The obtained wiring board was evaluated in the same manner as in Experiment 1. The results were as shown in Tables 11 and 12.

Moreover, an Ni-plated layer of a thickness of 2 μm and an Au-plated layer of a thickness of 1 μm were formed on the surface of the metallized layer for connection measuring 2 mm×20 mn, and an L-shaped lead of Fe—Ni—Co was brazed thereto with a brazing material 12 of Au—Sn. The lead was pulled in the vertical direction to measure the strength (kgf) of when the lead was removed from the insulating substrate. The results were as shown in Tables 11 and 12.

TABLE 9

| Sample No. | Amount of MnO2 in the insulating substrate (% by wt.) | Wiring layer composition (% by vol.) Cu W, Mo | Composition of metallized layer for connection | | | | Firing temperature (° C.) |
|---|---|---|---|---|---|---|---|
| | | | Main component (% by vol.) | Additive | Amount (% by vol.) | Amount of $Al_2O_3$ (% by vol.) | |
| 1 | 1.5 | 50 W 50 | W 64 | NiO | 1 | 35 | 1300 |
| 2 | 2 | 50 W 50 | W 64 | NiO | 1 | 35 | 1300 |
| 3 | 3 | 50 W 50 | W 64 | NiO | 1 | 35 | 1300 |
| 4 | 3.5 | 50 W 50 | W 64 | NiO | 1 | 35 | 1300 |
| 5 | 5 | 50 W 50 | W 64 | NiO | 1 | 35 | 1300 |
| 6 | 6 | 50 W 50 | W 64 | NiO | 1 | 35 | 1300 |
| 7 | 4 | 0 W 100 | W 64 | NiO | 1 | 35 | 1300 |
| 8 | 4 | 5 W 95 | W 64 | NiO | 1 | 35 | 1300 |
| 9 | 4 | 10 W 90 | W 64 | NiO | 1 | 35 | 1300 |
| 10 | 4 | 20 W 80 | W 64 | NiO | 1 | 35 | 1300 |
| 11 | 4 | 50 W 50 | W 64 | NiO | 1 | 35 | 1300 |
| 12 | 4 | 60 W 40 | W 64 | NiO | 1 | 35 | 1300 |
| 13 | 4 | 70 W 30 | W 64 | NiO | 1 | 35 | 1300 |
| 14 | 4 | 75 W 25 | W 64 | NiO | 1 | 35 | 1300 |
| 15 | 4 | 40 Mo 60 | W 64 | NiO | 1 | 35 | 1300 |
| 16 | 4 | 50 Mo 50 | W 64 | NiO | 1 | 35 | 1300 |
| 17 | 4 | 60 Mo 40 | W 64 | NiO | 1 | 35 | 1300 |
| 18 | 4 | 50 Mo, W 50 | W 64 | NiO | 1 | 35 | 1300 |
| 19 | 4 | 60 Mo, W 40 | W 64 | NiO | 1 | 35 | 1300 |
| 20 | 4 | 50 W 50 | W 65 | NiO | 0 | 35 | 1300 |
| 21 | 4 | 50 W 50 | W 64.9 | NiO | 0.1 | 35 | 1300 |
| 22 | 4 | 50 W 50 | W 63 | NiO | 2 | 35 | 1300 |
| 23 | 4 | 50 W 50 | W 60 | NiO | 5 | 35 | 1300 |
| 24 | 4 | 50 W 50 | W 59 | NiO | 6 | 35 | 1300 | note) The surface wiring layer and the internal wiring layer have the same composition.

TABLE 10

| Sample No. | Amount of MnO2 in the insulating substrate (% by wt.) | Wiring layer composition (% by vol.) Cu W, Mo | Composition of metallized layer for connection | | | | Firing temperature (° C.) |
|---|---|---|---|---|---|---|---|
| | | | Main component (% by vol.) | Additive | Amount (% by vol.) | Amount of $Al_2O_3$ (% by vol.) | |
| 25 | 4 | 50 W 50 | W 99 | NiO | 1 | 0 | 1300 |
| 26 | 4 | 50 W 50 | W 94 | NiO | 1 | 5 | 1300 |
| 27 | 4 | 50 W 50 | W 84 | NiO | 1 | 15 | 1300 |
| 28 | 4 | 50 W 50 | W 54 | NiO | 1 | 45 | 1300 |
| 29 | 4 | 50 W 50 | W 44 | NiO | 1 | 55 | 1300 |
| 30 | 4 | 50 W 50 | W 64 | $Fe_2O_3$ | 1 | 35 | 1300 |
| 31 | 4 | 50 W 50 | W 63.5 | $Co_3O_4$ | 1.5 | 35 | 1300 |
| 32 | 4 | 50 W 50 | W 64 | $Co_3O_4$ | 1 | 35 | 1300 |
| 33 | 4 | 50 W 50 | W 64 | $Fe_2O_3$ | 1 | 35 | 1300 |

TABLE 10-continued

| Sample No. | Amount of MnO2 in the insulating substrate (% by wt.) | Wiring layer composition (% by vol.) Cu | Wiring layer composition (% by vol.) W, Mo | Composition of metallized layer for connection Main component (% by vol.) | Composition of metallized layer for connection Additive | Amount (% by vol.) | Amount of Al₂O₃ (% by vol.) | Firing temperature (° C.) |
|---|---|---|---|---|---|---|---|---|
| 34 | 4 | 50 | W 50 | W 63.5 | Co₃O₄ | 1.5 | 35 | 1300 |
| 35 | 4 | 50 | W 50 | W 64 | Co₃O₄ | 1 | 35 | 1300 |
| 36 | 4 | 50 | W 50 | W 65 | Co₃O₄ | 0 | 35 | 1300 |
| 37 | 4 | 50 | W 50 | W 64.9 | Co₃O₄ | 0.1 | 35 | 1300 |
| 38 | 4 | 50 | W 50 | W 63 | Co₃O₄ | 2 | 35 | 1300 |
| 39 | 4 | 50 | W 50 | W 60 | Co₃O₄ | 5 | 35 | 1300 |
| 40 | 4 | 50 | W 50 | W 59 | Co₃O₄ | 6 | 35 | 1300 |
| 41 | 4 | 50 | W 50 | W 64 | NiO | 1 | 35 | 1150 |
| 42 | 4 | 50 | W 50 | W 64 | NiO | 1 | 35 | 1200 |
| 43 | 4 | 50 | W 50 | W 64 | NiO | 1 | 35 | 1250 |
| 44 | 4 | 50 | W 50 | W 64 | NiO | 1 | 35 | 1350 |
| 45 | 4 | 50 | W 50 | W 64 | NiO | 1 | 35 | 1400 |
| 46 | 4 | 50 | W 50 | W 64 | NiO | 1 | 35 | 1450 |
| 47 | 4 | 50 | W 50 | W 64 | NiO | 1 | 35 | 1500 | note) The surface wiring layer and the internal wiring layer have the same composition.

TABLE 11

| Sample No. | Insulating substrate Relative density (%) | Insulating substrate Thermal conductivity (W/mk) | Insulating substrate Volume resistivity (Ωcm) | Wiring layer W, Mo particle diameter (mμ) | Wiring layer Sheet resistance (mΩ/□) | Wiring layer Appearance | Mettallized layer for Connection Adhesion strength (kgf) | Mettallized layer for Connection Plating property |
|---|---|---|---|---|---|---|---|---|
| 1 | 94 | 8 | 10¹⁰ | 1.5 | 5 | good | 6 | good |
| 2 | 95 | 15 | >10¹⁴ | 1.5 | 4 | good | 6 | good |
| 3 | 98 | 17 | >10¹⁴ | 1.5 | 4 | good | 6 | good |
| 4 | 99 | 19 | >10¹⁴ | 1.5 | 4 | good | 6 | good |
| 5 | 99 | 19 | >10¹⁴ | 1.5 | 4 | good | 6 | good |
| 6 | 99 | 19 | >10¹⁴ | 1.5 | 4 | good | 6 | good |
| 7 | 99 | 18 | >10¹⁴ | 1.2 | 20 | good | 6 | good |
| 8 | 99 | 18 | >10¹⁴ | 1.3 | 10 | good | 6 | good |
| 9 | 99 | 18 | >10¹⁴ | 1.4 | 7 | good | 6 | good |
| 10 | 99 | 18 | >10¹⁴ | 1.5 | 7 | good | 6 | good |
| 11 | 99 | 18 | >10¹⁴ | 1.5 | 4 | good | 6 | good |
| 12 | 99 | 18 | >10¹⁴ | 2.0 | 4 | good | 6 | good |
| 13 | 99 | 18 | >10¹⁴ | 2.0 | 4 | good | 6 | good |
| 14 | 99 | 18 | >10¹⁴ | 2.5 | 9 | oozed, peeled | 6 | good |
| 15 | 99 | 18 | >10¹⁴ | 1.5 | 4 | good | 6 | good |
| 16 | 99 | 18 | >10¹⁴ | 1.5 | 4 | good | 6 | good |
| 17 | 99 | 18 | >10¹⁴ | 2 | 3 | good | 6 | good |
| 18 | 99 | 18 | >10¹⁴ | 1.5 | 4 | good | 6 | good |
| 19 | 99 | 18 | >10¹⁴ | 2 | 3 | good | 6 | good |
| 20 | 99 | 18 | >10¹⁴ | 1.5 | 4 | good | 2.5 | good |
| 21 | 99 | 18 | >10¹⁴ | 1.5 | 4 | good | 4 | good |
| 22 | 99 | 18 | >10¹⁴ | 1.5 | 4 | good | 5 | good |
| 23 | 99 | 18 | >10¹⁴ | 1.5 | 4 | good | 3 | good |
| 24 | 99 | 18 | >10¹⁴ | 1.5 | 4 | good | 2 | good |

TABLE 12

| Sample No. | Insulating substrate Relative density (%) | Insulating substrate Thermal conductivity (W/mk) | Insulating substrate Volume resistivity (Ωcm) | Wiring layer W, Mo particle diameter (mμ) | Wiring layer Sheet resistance (mΩ/□) | Wiring layer Appearance | Mettallized layer for Connection Adhesion strength (kgf) | Mettallized layer for Connection Plating property |
|---|---|---|---|---|---|---|---|---|
| 25 | 99 | 18 | >10¹⁴ | 1.5 | 4 | good | 3 | good |
| 26 | 99 | 18 | >10¹⁴ | 1.5 | 4 | good | 5 | good |

TABLE 12-continued

| | Insulating substrate | | | Wiring layer | | | Mettallized layer for Connection | |
|---|---|---|---|---|---|---|---|---|
| Sample No. | Relative density (%) | Thermal conductivity (W/mk) | Volume resistivity ($\Omega$cm) | W, Mo particle diameter (m$\mu$) | Sheet resistance (m$\Omega$/□) | Appearance | Adhesion strength (kgf) | Plating property |
| 27 | 99 | 18 | >$10^{14}$ | 1.5 | 4 | good | 6 | good |
| 28 | 99 | 18 | >$10^{14}$ | 1.5 | 4 | good | 3.5 | good |
| 29 | 99 | 18 | >$10^{14}$ | 1.5 | 4 | good | 2.5 | plating missing |
| 30 | 99 | 18 | >$10^{14}$ | 1.5 | 4 | good | 4.5 | good |
| 31 | 99 | 18 | >$10^{14}$ | 1.5 | 4 | good | 5 | good |
| 32 | 99 | 18 | >$10^{14}$ | 1.5 | 4 | good | 4.5 | good |
| 33 | 99 | 18 | >$10^{14}$ | 1.5 | 4 | good | 4.5 | good |
| 34 | 99 | 18 | >$10^{14}$ | 1.5 | 4 | good | 5 | good |
| 35 | 99 | 18 | >$10^{14}$ | 1.5 | 4 | good | 4 | good |
| 36 | 99 | 18 | >$10^{14}$ | 1.5 | 4 | good | 2.5 | good |
| 37 | 99 | 18 | >$10^{14}$ | 1.5 | 4 | good | 4 | good |
| 38 | 99 | 18 | >$10^{14}$ | 1.5 | 4 | good | 5 | good |
| 39 | 99 | 18 | >$10^{14}$ | 1.5 | 4 | good | 3 | good |
| 40 | 99 | 18 | >$10^{14}$ | 1.5 | 4 | good | 2 | good |
| 41 | 92 | 8 | $10^{10}$ | 0.8 | 9 | good | 1.5 | plating missing |
| 42 | 95 | 15 | >$10^{14}$ | 1.0 | 4 | good | 4 | good |
| 43 | 98 | 16 | >$10^{14}$ | 1.2 | 4 | good | 5 | good |
| 44 | 99 | 19 | >$10^{14}$ | 3.0 | 4 | good | 6 | good |
| 45 | 99 | 19 | >$10^{14}$ | 4.0 | 5 | good | 6 | good |
| 46 | 99 | 19 | >$10^{14}$ | 6.0 | 6 | good | 4 | good |
| 47 | 99 | 20 | >$10^{14}$ | 9.0 | 7 | good | 3 | good |

In the case of the sample No. 1 containing less than 2% by weight of $MnO_2$ in the insulating substrate as shown in Tables 9 to 12, the insulating substrate was not sintered to a sufficient degree and the relative density of not smaller than 95% could not be accomplished. Besides, the insulating substrate exhibited decreased thermal conductivity and insulating property, and could not be used as the wiring board.

In the case of samples Nos. 7 and 8 in which the content of copper was smaller than 10% by volume in the wiring layer composition, the sheet resistance was larger than 8 milliohms/□. In the case of a sample No. 14 in which content of copper was more than 70% by volume, the wiring exhibited poor shape retentivity, the texture became nonuniform, the sheet resistance was larger than 8 milliohms/□, and the wiring layer was oozed and partly peeled.

In the case of samples Nos. 20 and 36 containing less than 0.1% by volume of a metal of the Group of iron and in the case of samples Nos. 24 and 40 containing more than 5% by volume of a metal of the Group of iron in the metallized layer for connection, the adhesion strengths were small. In the case of a sample No. 29 containing more than 45% by volume of $Al_2O_3$, the adhesion strength was small and the plating had been missing. In the case of a sample No. 41 co-fired at a temperature of lower than 1200° C., the relative density of not lower than 95% could not be accomplished, and the thermal conductivity decreased, too.

In the wiring boards (samples Nos. 2 to 6, 9 to 13, 15 to 19, 21 to 23, 25 to 28, 30 to 35, 37 to 39, 42 to 47) having the surface wiring layer containing a metal of the Group of iron in predetermined amounts in the metallized layer for connection, in contrast with the above samples, the insulating substrate possessed a relative density of not smaller than 95% and thermal conductivity of not smaller than 15 W/M·K. Besides, the wiring layer could be formed by the co-firing without being oozing or peeled, and having a sheet resistance of not larger than 8 milliohms/□. Besides, the metallized layer for connection possessed an adhesion strength of not smaller than 3 kgf and a favorable plating property.

[Experiment 4]

Green sheets having through-holes were prepared in the same manner as in Experiment 2-2.

Further, a copper powder having an average particle diameter of 5 $\mu$m, and a tungsten powder or a molybdenum powder having an average particle diameter of from 0.8 to 12 $\mu$m were mixed together at ratios shown in Table 13, and to which were further added an acrylic binder and acetone to prepare conducting pastes for the surface wiring layer and conducting pastes for the internal wiring layer.

Then, the conducting pastes for the surface wiring layer or the conducting pastes for the internal wiring layer were applied by printing onto the surfaces of the green sheets in the shape of a wiring pattern. The conducting pates for the internal wiring layer were further charged into the through-holes in the sheets thereby to prepare insulating sheets for the surface layer and insulating sheets for the inner layer.

The insulating sheets for the surface layer and the insulating sheets for the inner layer were positioned and laminated with the application of pressure, so that the insulating sheet for the surface layer became the uppermost layer, thereby to prepare a laminate having 4 layers. The laminate was dewaxed in an oxygen-containing atmosphere ($N_2+O_2$ or open atmosphere) without substantially containing moisture, and was fired at 1300° C. in an nitrogen/hydrogen mixture atmosphere having a dew point of −10° C. to obtain a wiring board.

Further, various metal layers shown in Table 13 were formed on the surfaces of the wiring boards by the electro-lytic plating method.

Separately, a laminate of sheet-like molded articles without coated with paste was fired under the same conditions as those described above to prepare a sintered product thereof which was measured for its relative density by the Archimedes' method. The relative density was 99.5%, and the thermal conductivity (3 mm thick) was 18 W/m·K and the volume specific resistivity was not smaller than $10^{14}$ mΩ/□ as measured by the laser flash method.

Further, the wiring boards having metal layers formed on the surface wiring layers were evaluated in the same manner as in Experiment 1. The result were as shown in Table 13.

Through-holes for thermal vias were formed in the green sheets at predetermined places by using a microdrill in such a manner that the diameter after firing became 0.1 mm. The through-holes for thermal vias were filled with a conducting paste obtained by mixing a copper powder having an average particle diameter of 5 μm, a tungsten powder or a molybdenum powder having an average particle diameter of from 0.8 to 10 μm at ratios shown in Tables 14 and 15, and by adding thereto an acrylic binder and acetone.

The thus prepared sheets were suitably positioned and laminated with the application of pressure to prepare a laminate of 4 layers. The laminate was then dewaxed in an

TABLE 13

| Sample No. | Internal wiring layer Composition (% by vol.) Cu W, Mo | Sheet resistance Ra (mΩ/□) | Surface wiring layer Composition (% by vol.) Cu W, Mo | Sheet resistance Rb (mΩ/□) | Shape retentivity adhesiveness | Metal layer kind | thickness (μm) | Sheet resistance of surface wiring layer + metal layer Rc (mΩ/□) |
|---|---|---|---|---|---|---|---|---|
| 1 | 10 W 90 | 8 | 0 W 100 | 20 | good | Ni—Au | 3 | 10 |
| 2 | 10 W 90 | 8 | 10 W 90 | 8 | good | Ni—Au | 3 | 6 |
| 3 | 20 W 80 | 6 | 10 W 90 | 8 | good | Ni—Au | 3 | 6 |
| 4 | 40 W 60 | 5 | 20 W 80 | 6 | good | Ni—Au | 3 | 5 |
| 5 | 40 W 60 | 5 | 30 W 70 | 6 | good | Ni—Au | 3 | 5 |
| 6 | 50 W 50 | 4 | 40 W 60 | 5 | good | Ni—Au | 3 | 3 |
| 7 | 70 W 30 | 4 | 50 W 50 | 4 | good | Ni—Au | 3 | 3 |
| 8 | 60 W 40 | 4 | 50 W 50 | 4 | good | Ni—Au | 3 | 3 |
| 9 | 70 W 30 | 3 | 60 W 40 | 4 | good | Ni—Au | 3 | 3 |
| 10 | 80 W 20 | 3 | 70 W 30 | 10 | slightly bad | Ni—Au | 3 | 7 |
| 11 | 80 W 20 | 3 | 80 W 20 | 25 | bad | Ni—Au | 3 | 20 |
| 12 | 85 W 15 | 8 | 80 W 20 | 25 | bad | Ni—Au | 3 | 20 |
| 13 | 70 W 30 | 4 | 60 W 40 | 4 | good | Pd—Au | 3 | 3 |
| 14 | 70 W 30 | 4 | 60 W 40 | 4 | good | Cu—Au | 3 | 3 |
| 15 | 70 W 30 | 4 | 60 W 40 | 4 | good | Ti—Au | 3 | 3 |
| 16 | 50 Mo 50 | 4 | 40 Mo 60 | 5 | good | Ni—Au | 3 | 3 |
| 17 | 70 Mo 30 | 4 | 60 Mo 40 | 4 | good | Cu—Au | 3 | 3 |

In the case of the sample No. 1 containing less than 10% by volume of copper in the surface wiring layer composition as shown in Table 13, the sheet resistance was larger than 8 milliohms/□ even after it was plated. In the case of the samples Nos. 11 and 12 containing copper in amounts of more than 70% by volume in the surface wiring layer composition, the wiring exhibited poor shape retentivity, the texture was nonuniform, the sheet resistance was larger than 8 milliohms/□, and the surface wiring layer was oozed and partly peeled. In the case of the sample No. 12 containing larger than 80% by volume of copper in the internal wiring layer composition, the internal wiring layer exhibited a sheet resistance of larger than 6 milliohms/□. In the case of the sample No. 2 containing copper in an amount of not larger than that of the surface wiring layer, the sheet resistance was not smaller than that of the surface wiring layer of after it was plated.

In the wiring boards of the samples Nos. 3 to 10 and 13 to 17, the distances were measured at 10 places from an end of the wiring layer through up to the outermost region where copper could be detected on the same plane relying on the EPMA (X-ray microanalyzer) analysis. A favorable diffusion distance of not longer than 20 μm in average was exhibited by the wiring layers.

[Experiment 5]

Green sheets were prepared in the same manner as in Experiment 1 by mixing the aluminum oxide powder, $MnO_2$, $SiO_2$ and MgO at ratios shown in Tables 14 and 15.

oxygen-containing atmosphere ($N_2+O_2$ or open atmosphere) without substantially containing moisture, and was fired at temperatures shown in Tables 14 and 15 in an nitrogen/hydrogen mixture atmosphere having a dew point of −10° C. to obtain a wiring board.

Figure 5:
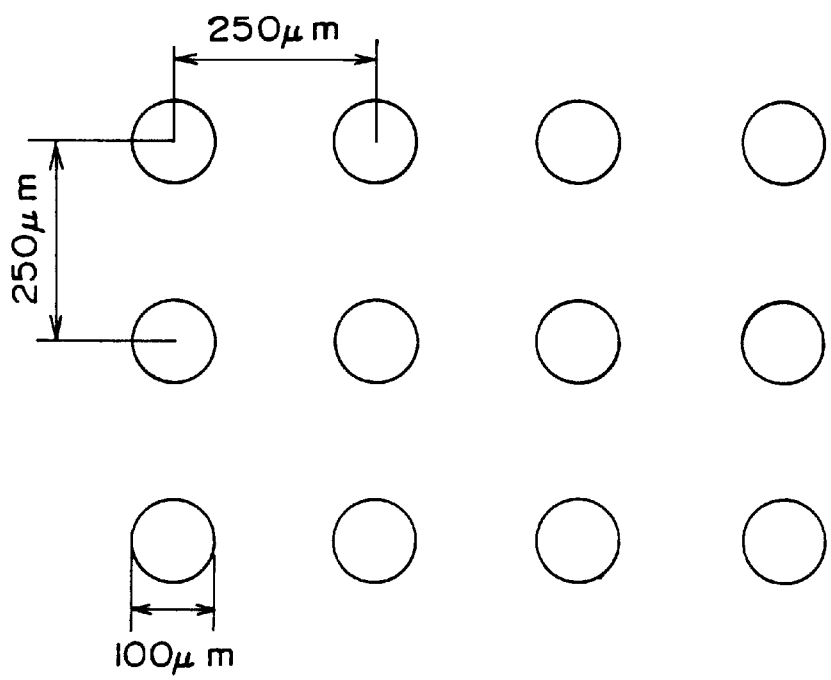
FIG. 5 is a plan view illustrating the arrangement of thermal vias formed in the wiring board prepared in experiment 5.

The thermal vias in the wiring board were arranged in the whole surface of the insulating substrate like a lattice as shown in FIG. 5, and the distance among the centers of the neighboring thermal vias was 250 μm.

The wiring boards (3 mm thick) were measured for their thermal conductivities by the laser flush method. The results were as shown in Tables 14 and 15.

Furthermore, the insulating boards (10 mm in diameter, 3 mm thick) prepared in the same manner as described above but without forming thermal vias were measured for their relative densities and thermal conductivities in the same manner as in Experiment 1. The results were as shown in Tables 14 and 15.

The texture of the thermal vias formed in the wiring board was observed by using a scanning-type electron microscope to measure the diameters of tungsten particles or molybdenum particles in the thermal vias. The results were as shown in Tables 14 and 15.

TABLE 14

| Sample No. | Composition of insulating Substrate (% by wt.) | | | | Conductor composition (vol. ratio) | | Firing condition | | Relative density (%) | Particle diameter (μm) | Thermal conductivity of insulating substrate (W/mk) | Thermal conductivity (W/mk) of thermal via + insulating substrate | Volume specific resistivity (mΩ/□) |
|---|---|---|---|---|---|---|---|---|---|---|---|---|---|
| | Main component | MnO₂ | SiO₂ | MgO | Cu | W, Mo | temp. (° C.) | atmosphere | | | | | |
| 1 | Al₂O₃ | 1.5 | — | — | 50 | W 50 | 1300 | N₂ + H₂ | 90 | 1.5 | 8 | 15 | $10^{-10}$ |
| 2 | Al₂O₃ | 1.5 | — | — | 50 | W 50 | 1550 | N₂ + H₂ | 93 | 10 | 10 | 18 | $10^{-10}$ |
| 3 | Al₂O₃ | 2 | — | — | 50 | W 50 | 1300 | N₂ + H₂ | 95 | 1.5 | 15 | 50 | $>10^{-14}$ |
| 4 | Al₂O₃ | 3 | — | — | 50 | W 50 | 1300 | N₂ + H₂ | 95 | 1.5 | 17 | 52 | $>10^{-14}$ |
| 5 | Al₂O₃ | 4 | — | — | 50 | W 50 | 1300 | N₂ + H₂ | 97 | 1.5 | 19 | 54 | $>10^{-14}$ |
| 6 | Al₂O₃ | 8 | — | — | 50 | W 50 | 1300 | N₂ + H₂ | >99 | 1.5 | 19 | 54 | $>10^{-14}$ |
| 7 | Al₂O₃ | 10 | — | — | 50 | W 50 | 1300 | N₂ + H₂ | >99 | 1.5 | 19 | 54 | $>10^{-14}$ |
| 8 | Al₂O₃ | 4 | 3 | 0.5 | 0 | W 100 | 1300 | N₂ + H₂ | 97 | 1.5 | 18 | 19 | $>10^{-14}$ |
| 9 | Al₂O₃ | 4 | 3 | 0.5 | 5 | W 95 | 1300 | N₂ + H₂ | 97 | 1.5 | 18 | 24 | $>10^{-14}$ |
| 10 | Al₂O₃ | 4 | 3 | 0.5 | 10 | W 90 | 1300 | N₂ + H₂ | 97 | 1.5 | 18 | 35 | $>10^{-14}$ |
| 11 | Al₂O₃ | 4 | 3 | 0.5 | 20 | W 80 | 1300 | N₂ + H₂ | 97 | 1.5 | 18 | 38 | $>10^{-14}$ |
| 12 | Al₂O₃ | 4 | 3 | 0.5 | 30 | W 70 | 1300 | N₂ + H₂ | 97 | 1.5 | 18 | 44 | $>10^{-14}$ |
| 13 | Al₂O₃ | 4 | 3 | 0.5 | 50 | W 50 | 1300 | N₂ + H₂ | 97 | 1.5 | 18 | 54 | $>10^{-14}$ |

TABLE 15

| Sample No. | Composition of insulating Substrate (% by wt.) | | | | Conductor composition (vol. ratio) | | Firing condition | | Relative density (%) | Particle diameter (μm) | Thermal conductivity of insulating substrate (W/mk) | Thermal conductivity (W/mk) of thermal via + insulating substrate | Volume specific resistivity (mΩ/□) |
|---|---|---|---|---|---|---|---|---|---|---|---|---|---|
| | Main component | MnO₂ | SiO₂ | MgO | Cu | W, Mo | temp. (° C.) | atmosphere | | | | | |
| 14 | Al₂O₃ | 4 | 3 | 0.5 | 60 | W 40 | 1300 | N₂ + H₂ | 97 | 2 | 18 | 60 | $>10^{-14}$ |
| 15 | Al₂O₃ | 4 | 3 | 0.5 | 70 | W 30 | 1300 | N₂ + H₂ | 97 | 2 | 18 | 65 | $>10^{-14}$ |
| 16 | Al₂O₃ | 4 | 3 | 0.5 | 75 | W 25 | 1300 | N₂ + H₂ | 97 | 2.5 | 18 | 28 | $>10^{-14}$ |
| 17 | Al₂O₃ | 4 | 3 | 0.5 | 40 | Mo 60 | 1300 | N₂ + H₂ | 97 | 2 | 18 | 50 | $>10^{-14}$ |
| 18 | Al₂O₃ | 4 | 3 | 0.5 | 50 | Mo 50 | 1300 | N₂ + H₂ | 97 | 2 | 18 | 53 | $>10^{-14}$ |
| 19 | Al₂O₃ | 4 | 3 | 0.5 | 60 | Mo 40 | 1300 | N₂ + H₂ | 97 | 2 | 18 | 58 | $>10^{-14}$ |
| 20 | Al₂O₃ | 4 | 3 | 0.5 | 50 | W 50 | 1150 | N₂ + H₂ | 90 | 0.8 | 8 | 15 | $>10^{-14}$ |
| 21 | Al₂O₃ | 4 | 3 | 0.5 | 50 | W 50 | 1200 | N₂ + H₂ | 95 | 1 | 15 | 40 | $>10^{-14}$ |
| 22 | Al₂O₃ | 4 | 3 | 0.5 | 50 | W 50 | 1250 | N₂ + H₂ | 96 | 1.2 | 16 | 45 | $>10^{-14}$ |
| 23 | Al₂O₃ | 4 | 3 | 0.5 | 50 | W 50 | 1350 | N₂ + H₂ | 98 | 3 | 19 | 55 | $>10^{-14}$ |
| 24 | Al₂O₃ | 4 | 3 | 0.5 | 50 | W 50 | 1400 | N₂ + H₂ | >99 | 4 | 19 | 57 | $>10^{-14}$ |
| 25 | Al₂O₃ | 4 | 3 | 0.5 | 50 | W 50 | 1450 | N₂ + H₂ | >99 | 6 | 19 | 55 | $>10^{-14}$ |
| 26 | Al₂O₃ | 4 | 3 | 0.5 | 50 | W 50 | 1500 | N₂ + H₂ | >99 | 9 | 20 | 48 | $>10^{-14}$ |

In the case of the sample No. 1 containing smaller than 2% by weight of $MnO_2$ in the insulating substrate as shown in Tables 14 and 15, the insulating substrate was not sintered to a sufficient degree at 1300° C., the relative density of not smaller than 95% was not accomplished, the substrate exhibited a decreased thermal conductivity and decreased insulating property, and could not be used as the wiring board. In the case of the sample No. 2 fired at 1550° C., the insulating substrate could be densely formed, but copper eluted out from the thermal vias and the thermal conductivity has decreased.

In the case of the samples Nos. 8 and 9 containing smaller than 10% by volume of copper in the thermal via composition, the thermal conductivity of the thermal via+ insulating substrate was smaller than 30 W/M·K and advantage stemming from copper could not be obtained to a sufficient degree. In the case of the sample No. 16 containing more than 70% by weight of copper, the thermal vias exhibited poor shape retentivity, the texture was nonuniform, conduction was broken in the thermal vias and, hence, the thermal conductivity due to (thermal vias+ insulating substrate) was as low as 28 W/M·K. Besides, oozing occurred around the thermal vias.

In the case of the sample No. 20 co-fired at a temperature of lower than 1200° C., the relative density of not lower than 95% was not accomplished and the thermal conductivity has decreased.

In the wiring boards (samples Nos. 3 to 7, 10 to 15, 17 to 19, 21 to 26) having the thermal vias of a predetermined composition, in contrast with the above samples, the insulating substrate possessed a relative density of 95% and thermal conductivity due to (thermal vias+insulating substrate) of not smaller than 30 W/M·K. Besides, the thermal vias having small resistance and good heat conductivity could be formed by the co-firing without being oozing around the thermal vias. In the these boards, furthermore, the distances were measured at 10 places from an end of the wiring layer through up to the outermost region where copper could be detected on the same plane relying on the EPMA (X-ray microanalyzer) analysis. A favorable diffusion distance of not longer than 20 µm in average was exhibited by the wiring layers.

What is claimed is:

1. A wiring board having an insulating substrate of aluminum oxide ceramics and a surface wiring layer formed on a surface of said insulating substrate;

wherein the aluminum oxide ceramics constituting said insulating substrate contains a manganese compound in an amount of from 2.0 to 10.0% by weight in terms of $MnO_2$, and has a relative density of not smaller than 95%; and said surface wiring layer contains copper in an amount of from 10 to 70% by volume and at least one high-melting metal selected from the group consisting of tungsten and molybdenum in an amount of from 30 to 90% by volume, wherein the copper forms a matrix having a diffusion structure in which are diffused particles of said high-melting metal having an average particle diameter of from 1 to 10 µm.

2. A wiring board according to claim 1, wherein said surface wiring layer contains a transition metal other than tungsten and molybdenum in an amount of from 0.01 to 5 parts by volume in terms of a metal per 100 parts by volume of the total amount of copper and said high-melting metal.

3. A wiring board according to claim 2, wherein said transition metal is at least one selected from the group consisting of Ti, Nb, Cr, Mn, Fe, Co and Ni.

4. A wiring board according to claim 2, wherein a metal fitting is brazed onto the surface wiring layer.

5. A wiring board according to claim 1, wherein a metallized layer for connection is formed on a front surface or a back surface of said insulating substrate, and said metallized layer for connection contains said high-melting metal in an amount of not smaller than 50% by volume and contains a Group VIII metal in an amount of from 0.1 to 5% by volume in terms of an oxide thereof.

6. A wiring board according to claim 5, wherein said metallized layer for connection contains aluminum oxide in an amount of not larger than 45% by volume.

7. A wiring board according to claim 1, wherein an internal wiring layer is formed in said insulating substrate.

8. A wiring board according to claim 1, wherein the aluminum oxide ceramics contains the manganese compound in an amount of from 3.0 to 10.0% by weight in terms of $MnO_2$.

9. A wiring board having an insulating substrate of aluminum oxide ceramics, a surface wiring layer formed on a surface of said insulating substrate, and an internal wiring layer formed in the insulating substrate;

wherein the aluminum oxide ceramics constituting said insulating substrate contains a manganese compound in an amount of from 2.0 to 10.0% by weight in terms of $MnO_2$, and has a relative density of not smaller than 95%, wherein said surface wiring layer contains copper in an amount of from 10 to 70% by volume and at least one high-melting metal selected from the group consisting of tungsten and molybdenum in an amount of from 30 to 90% by volume, wherein the copper forms a matrix having a diffusion structure in which are diffused particles of said high-melting metal having an average particle diameter of from 1 to 10 µm, and wherein said internal wiring layer contains copper in an amount of from 20 to 80% by volume and said high-melting metal in an amount of from 20 to 80% by volume, the content of copper in said internal wiring layer being larger than that in said surface wiring layer.

10. A wiring board having an insulating substrate of aluminum oxide ceramics, a surface wiring layer formed on a surface of said insulating substrate, and an internal wiring layer formed in the insulating substrate;

wherein the aluminum oxide ceramics constituting said insulating substrate contains a manganese compound in an amount of from 2.0 to 10.0% by weight in terms of $MnO_2$, and has a relative density of not smaller than 95%, wherein said surface wiring layer contains copper in an amount of from 10 to 70% by volume and at least one high-melting metal selected from the group consisting of tungsten and molybdenum in an amount of from 30 to 90% by volume, wherein the copper forms a matrix having a diffusion structure in which are diffused particles of said high-melting metal having an average particle diameter of from 1 to 10 µm, and wherein an aluminum oxide crystal phase having an average particle diameter of from 1.5 to 5.0 µm is precipitated in the aluminum oxide ceramics constituting the insulating substrate, the fired surface of said insulating substrate has a surface coarseness Ra (JIS B-0601) of not larger than 1 µm, and the diffusion distance of copper in said surface wiring layer and in said internal wiring layer into the surrounding ceramics is not larger than 20 µm.

11. A wiring board having an insulating substrate of aluminum oxide ceramics and a surface wiring layer formed on a surface of said insulating substrate;

wherein the aluminum oxide ceramics constituting said insulating substrate contains a manganese compound in an amount of from 2.0 to 10.0% by weight in terms of $MnO_2$, and has a relative density of not smaller than 95%, wherein said surface wiring layer contains copper in an amount of from 10 to 70% by volume and at least one high-melting metal selected from the group consisting of tungsten and molybdenum in an amount of from 30 to 90% by volume, wherein the copper forms a matrix having a diffusion structure in which are diffused particles of said high-melting metal having an average particle diameter of from 1 to 10 µm, and wherein thermal vias for radiating heat are formed in said insulating substrate so as to penetrate from a front surface thereof up to a back surface thereof, said thermal vias containing copper in an amount of from 10 to 70% by volume and said high-melting metal in an amount of from 30 to 90% by volume.

* * * * *